US012772651B2

(12) United States Patent
Eltawil et al.

(10) Patent No.: US 12,772,651 B2
(45) Date of Patent: Oct. 20, 2026

(54) POLYMER AND PEROVSKITE COMPOSITE-BASED PHOTORECEPTOR AND METHOD

(71) Applicant: KING ABDULLAH UNIVERSITY OF SCIENCE AND TECHNOLOGY, Thuwal (SA)

(72) Inventors: Ahmed M. Eltawil, Irvine, CA (US); Mohammed E. Fouda, Irvine, CA (US); Boon S. Ooi, Thuwal (SA); Khaled Nabil Salama, Thuwal (SA); Mani Teja Vijjapu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 425 days.

(21) Appl. No.: 18/700,819

(22) PCT Filed: Oct. 11, 2022

(86) PCT No.: PCT/IB2022/059748

§ 371 (c)(1),
(2) Date: Apr. 12, 2024

(87) PCT Pub. No.: WO2023/062539

PCT Pub. Date: Apr. 20, 2023

(65) Prior Publication Data

US 2024/0422997 A1 Dec. 19, 2024

Related U.S. Application Data

(60) Provisional application No. 63/255,556, filed on Oct. 14, 2021.

(51) Int. Cl.
*H10K 10/10* (2023.01)
*G06N 3/049* (2023.01)
(Continued)

(52) U.S. Cl.
CPC ............. *H10K 10/10* (2023.02); *G06N 3/049* (2013.01); *H10K 10/84* (2023.02); *H10K 19/00* (2023.02);
(Continued)

(58) Field of Classification Search
CPC ........ H10K 10/10; H10K 10/84; H10K 19/00; H10K 30/82; H10K 39/30; H10K 85/50;
(Continued)

(56) References Cited

U.S. PATENT DOCUMENTS

| | | | | |
|---|---|---|---|---|
| 10,922,608 | B2 * | 2/2021 | Suda | G06N 3/049 |
| 11,586,884 | B2 * | 2/2023 | Yang | B82Y 15/00 |

OTHER PUBLICATIONS

Agambayev, A., et al., "An Ultra-Broadband Single-Component Fractional-Order Capacitor using MoS2-Ferroelectric Polymer Composite," Applied Physics Letters, Aug. 30, 2018, vol. 113, pp. 093505-1-093505-5.

(Continued)

*Primary Examiner* — Seung C Sohn
(74) *Attorney, Agent, or Firm* — PATENT PORTFOLIO BUILDERS PLLC

(57) ABSTRACT

A capacitive photoresistor array having frequency-independent capacitance includes first and second electrodes and a composite material including a perovskite and a terpolymer. The composite material is sandwiched between the first electrode and the second electrode, and a capacitance of the array changes proportionally with a light intensity for visible light and is independent of light frequency due to a combination of the perovskite and the terpolymer.

20 Claims, 31 Drawing Sheets

(51) Int. Cl.

| | |
|---|---|
| ***H10K 10/84*** | (2023.01) |
| ***H10K 19/00*** | (2026.01) |
| ***H10K 30/82*** | (2023.01) |
| ***H10K 39/30*** | (2026.01) |
| ***H10K 85/50*** | (2023.01) |
| ***H10K 102/10*** | (2023.01) |

(52) U.S. Cl.
CPC ............ *H10K 30/82* (2023.02); *H10K 39/30* (2023.02); *H10K 85/50* (2023.02); *H10K 2102/103* (2023.02)

(58) Field of Classification Search
CPC .. H10K 2102/103; G06N 3/049; H01G 4/018; H01G 4/206; H10F 39/192; H10F 39/80
See application file for complete search history.

(56) References Cited

OTHER PUBLICATIONS

Al-Amri, A.M., et al., "Perovskite Methylammonium Lead Trihalide Heterostructures: Progress and Challenges," IEEE Transactions on Nanotechnology, Jan. 2018, vol. 18, pp. 1-12, IEEE.
Artificial Electronic Retina Recognises Handwritten Numbers, The Engineer, downloaded Sep. 28, 2022 (www.theengineer.co.uk/content/news/artificial-electronic-retina-recognises-handwritten-numbers), pp. 1-2.
Bao, L., et al., "Artificial Shape Perception Retina Network Based on Tunable Memristive Neurons," Scientific Reports, Sep. 13, 2018, vol. 8, No. 13727, pp. 1-9.
Building Applications Inspired by the Human Eye, King Abdullah University of Science and Technology, downloaded Sep. 29, 2022 (www.kaust.edu.sa/en/news/building-applications-inspired-by-the-human-eye), pp. 1-4.
Chai, Y., "In-Sensor Computing for Machine Vision," Nature, Mar. 5, 2020, vol. 579, pp. 32-33, Springer Nature Limited.
Gu, L., et al., "A Bomimetic Eye with a Hemispherical Perovskite Nanowire Array Retina," Nature, May 21, 2020, vol. 581, pp. 278-284.
International Search Report in corresponding/related International Application No. PCT/IB2022/059748, date of mailing Jan. 18, 2023.
Kholkin, A.L., et al., "Direct Effect of Illumination on Ferroelectric Properties of Lead Zirconate Titanate Thin Films," Applied Physics Letters, Sep. 24, 2001, vol. 79, No. 13, pp. 2055-2057.
Lee, H., et al., "Strong Photo-Amplification Effects in Flexible Organic Capacitors with Small Molecular Solid-State Electrolyte Layers Sandwiched between Photo-Sensitive Conjugated Polymer Nanolayer," Scientific Reports, Feb. 5, 2016, vol. 6, No. 19527, pp. 1-9.
Lee, J., et al., "Effect of Ultraviolet Light on Fatigue of Lead Zirconate Titanate Thin-Film Capacitors," Applied Physics Letters, Jul. 11, 1994, vol. 65, No. 254, pp. 254-256.
Leung, S.-F., et al., "A Self-Powered and Flexible Organometallic Halide Perovskite Photodetector with Very High Detectivity," Advanced Materials, Feb. 2018, vol. 30, pp. 1704611 1-8, WILEY-VCH Verlag Gmbh & Co.
Lichtsteiner, P.L., et al., "A 128 x 128 120 dB 15 us Latency Asynchronous Temporal Contrast Vision Sensor," Feb. 2008, vol. 43, No. 2, pp. 566-576.
Lim, J.W., et al., "An Active and Soft Hydrogel Actuator to Stimulate Live Cell Clusters by Self-Folding," Polymers, Mar. 5, 2020, vol. 12, No. 583, pp. 1-10.
Mennel, L., et al., "Ultrafast Machine Vision with 2D Material Neural Network Image Sensors," Nature, Mar. 4, 2020, vol. 579, pp. 62-78.
Miyasaka, T., et al., "The Photocapacitor: An Efficient Self-Charging Capacitor for Direct Storage of Solar Energy," Applied Physics Letters, Oct. 25, 2004, vol. 85, No. 17, pp. 3932-3934.
Mokni, M. et al., "High-Capacity, Fast-Response, and Photocapacitor-Based Terpolymer Phosphor Composite," Polymers, Feb. 6, 2020, vol. 12, No. 349, pp. 1-13.
Perovskites used to Make Efficient Artificial Retina | KAUST Discovery, King Abdullah University of Science and Technology, downloaded Sep. 28, 2022, (www.discovery.kaust.edu.sa/en/article/1198/perovskites-used-to-make-efficient-artificial-retina), pp. 1-3.
Realistic Retinas Make Better Bionic Eyes, Following Nature's Example More Closely Could Lead to Better Visual Sensors, Mar. 23, 2022, IEEE Spectrum, downloaded Sep. 28, 2022 (www.spectrum.ieee.org/realistic-retina-make-better-bionic-eyes), pp. 1-7.
Sultana, A., et al., "Organo-Lead Halide Perovskite Induced Electroactive B-Phase in Porous PVDF Films: An Excellent Material for Photoactive Piezoelectric Energy Harvester and Photodetector," Applied Materials & Interfaces, Jan. 8, 2018, vol. 10, No. 4, pp. 4121-4130.
Vijjapu, M.T., et al., A Flexible Capacitive Photoreceptor for the Biomimetic Retina, Light: Science & Applications, Jan. 1, 2022, vol. 11, No. 3.
Wang, Z., et al., "Capacitive Neural Network with Neuro-Transistors," Nature Communications, Aug. 10, 2018, vol. 9, No. 3208, pp. 1-10.
Written Opinion of the International Searching Authority in corresponding/related International Application No. PCT/IB2022/059748, date of mailing Jan. 18, 2023.
Zaher, A., et al., "Osmotically Driven Drug Delivery Through Remote-Controlled Magnetic Nanocomposite Membranes," Biomicrofluidics, Sep. 29, 2015, vol. 9, No. 054113, pp. 1-16, AIP Publishing LLC.
Zhang, L., et al., "Light Enhanced Energy Storage Ability Through a Hybrid Plasmonic Ag Nanowire Decorated Hydroxide Skin Structure", Nanoscale, Nov. 2, 2017, vol. 9, pp. 18430-18437, Royal Society of Chemistry.
Zhou, J., et al., "Photodetectors Based on Two-Dimensional Layer-Structured Hybrid Lead Iodide Perovskite Semiconductors," Applied Materials & Interfaces, Sep. 16, 2016, vol. 8, pp. 25660-25666, ACS Publications.

* cited by examiner

| $\mu w/cm^2$ | 9.4 | 15 | 23 | 247 | 562 | 1000 |
| --- | --- | --- | --- | --- | --- | --- |
| Greenish-yellow | 0.814% | 0.61% | 0.56% | | | |
| Violet | 0.626% | 0.394% | 0.875% | 0.927% | 0.85% | 0.8479% |
| Green | 2.29% | 3.37% | 2.64% | | | |
| Blue | 1.84% | 2.56% | 1.58% | | | |
| Yellowish-orange | 1.678% | 2.26% | 1.52% | | | |
| Red | 1.49% | | | | | |

FIG. 16

POLYMER AND PEROVSKITE COMPOSITE-BASED PHOTORECEPTOR AND METHOD

CROSS-REFERENCE TO RELATED APPLICATIONS

This application is a U.S. National Stage Application of International Application No. PCT/IB2022/059748, filed on Oct. 11, 2022, which claims priority to U.S. Provisional Patent Application No. 63/255,556, filed on Oct. 14, 2021, entitled "PEROVSKITE AND POLYMER COMPOSITE-BASED FLEXIBLE CAPACITIVE PHOTORECEPTOR FOR THE NEUROMORPHIC VISION SENSORS," the disclosures of which are incorporated herein by reference in their entirety.

BACKGROUND

Technical Field

Embodiments of the subject matter disclosed herein generally relate to a photoreceptor and method for detecting visible light, and more particularly, to a polymer and perovskite composite-based flexible capacitive photoreceptor that acts as a neuromorphic vision sensor.

Discussion of the Background

The biomimetic microelectronic devices are indispensable for human-inspired robotics and neuromorphic computing applications. A change in the paradigm from sensing to perception aided by machine learning and deep neural networks currently revolutionizes the perceptive intelligence, such as computer vision and voice processing. The human brain receives most of the information (80%) through the eyesight. Various hierarchical perceptive processes take place in the eye to form the vision in the brain. These include light propagation through the eye to the retina, retina photoreceptor cells' photon reception, and encoding the illumination information into varying spike frequencies through ganglion cells of the retina. The photoreceptor cells, namely rod cells and cone cells absorb the light in the retina. The rod cells' density in the retina is much higher than the cone cells, and they are responsible for light sensing in low light conditions whereas the cone cells are responsible for light sensing in bright conditions.

The typical schematic of a single rod cell 100 is shown in FIG. 1A. The rod cell 100 has an outer segment 110, an inner segment 120, a nucleus 130, and synaptic terminals 140. The outer segment 110 of the rod cell 100 is photosensitive due to the presence of pigments called retinal and opsin, which are located in the rhodopsin 112, which is shown in FIG. 1B. These pigments in the rod cell are responsible for the change in the membrane potential upon light illumination 104 (as also illustrated in FIG. 1B). The rod cell membrane undergoes hyperpolarization upon light illumination, and this results in a decrease in the spiking frequency of the rod cells. Thus, the photoreceptor cells encode the light information into a spike train, which is transmitted through the nucleus 130 and the synapses 140 to the ganglion cells (not shown) for further visual transduction processes. The retina of the eye (which includes the rod and cone cells) performs parallel signal operation (note that the retina includes plural rod cells 100) and follows the computing strategy known as computing in the sensor [1]. This parallel computing is schematically illustrated in FIG. 1B, portion 150. An artificial retina network, which is illustrated in FIG. 1B, portion 152, mimics the natural retina by ideally using photoreceptor neurons 154 that are as sensitive as the rod cells, and are also arranged in parallel for faster and smarter data processing than the conventional image processing devices [2, 3].

To construct an artificial retina network 152, it requires a tunable artificial neuron 154 with functionalities of photoreceptors cells and ganglion cells. In other words, the membrane potential in the photoreceptor neurons 154 is affected by the light signals 104 in addition to the electrical signals of other neurons. The traditional integrate-and-fire neuron model for data processing does not possess the functionality of such photoreceptors. There are few works that perform image sensing mimicking the human eye. For example, [4] demonstrated a hemispherical eye developed using silicon (Si) nano-membrane in an origami approach, and this group has employed Si photodetectors as photoreceptors. Recently, the authors in [5] demonstrated a perovskite-based hemispherical biomimetic eye for robotics and visual prosthesis applications. This group have fabricated a perovskite nanowire array as photoreceptors and demonstrated image sensing using the eye. However, each pixel in these biomimetic eyes requires biasing, which leads to high static power consumption since they are photodetectors and closer to the conventional image sensors.

One of the popular biological vision cameras, called dynamic vision sensing (DVS) cameras, employs photodiodes as photoreceptors [6]. The capacitors are usually used to mimic the cell membrane in CMOS-based electrical neurons [2]. Moreover, the capacitive neural networks, rather than the resistive/conductance-based approach, featured better emulation of neural functionalities and low static power consumption. Thus, there is a need for a tunable photoreceptor to develop artificial retina networks for efficient, perceptive intelligent applications.

Furthermore, there are studies on the capacitors using lead zirconate titanate (PZT) thin films that are sensitive to UV illumination [7, 8]. These thin-films exhibit varying dielectric properties upon light illumination, but not under visible wavelength. Note that visible light is considered herein to be light having a frequency between 380 and 750 nm. Such a phenomenon has been useful in developing photosensitive and photostrictive actuators. There also reports on visible light photo capacitors for the charge storage using dye-sensitized semiconducting nanoparticles [9], phosphors [10], photosensitive conjugated polymers [11], and through a hybrid plasmonic effect of Ag nanowires [12]. However, hybrid perovskites [13, 14] attracted considerable attention because of their exceptional optoelectronic properties such as excellent light absorption, long carrier lifetime, low trap density, giant optical anisotropy, and high carrier mobility. Thanks to these properties, higher photocurrents and higher quantum efficiencies were observed in perovskite-based optoelectronic devices, namely: solar cells, photodetectors, photo-transistors, and devices for various applications like photo-sensing, lasing and emission.

However, the hybrid perovskites are sensitive to moisture and oxygen, resulting in degradation of the device performance, which is the major hurdle for the commercialization of perovskite devices. Thus, there is a need for a new material that is capable of achieving the perovskite's properties discussed above but is also stable when exposed to moisture and/or oxygen for achieving a photoreceptor that can be safely used for neuromorphic applications.

BRIEF SUMMARY OF THE INVENTION

According to an embodiment, there is a capacitive photoresistor array having frequency-independent capacitance, and the array includes first and second electrodes, and a composite material including a perovskite and a terpolymer. The composite material is sandwiched between the first electrode and the second electrode, and a capacitance of the array changes proportionally with a light intensity for visible light and is independent of light frequency due to a combination of the perovskite and the terpolymer.

According to another embodiment, there is a vision sensor for generating spike train signals with a firing rate proportional to an incident light intensity and a corresponding color received from an object. The sensor includes a capacitive photoresistor array having a frequency-independent capacitance, the array configured to transform the incident light into electrical signals, a sensing circuit system connected to the array and configured to transform the electrical signals into the spike train signals, and a spiking neural network, SNN, connected to the sensing circuit and configured to identify the object based on the spike train signals received from the sensing circuit system.

BRIEF DESCRIPTION OF THE DRAWINGS

For a more complete understanding of the present invention, reference is now made to the following descriptions taken in conjunction with the accompanying drawings, in which:

FIG. 16 shows the normalized root mean square error results of the curve fitted model with at most 3.37% error;

DETAILED DESCRIPTION OF THE INVENTION

Figure 1A:
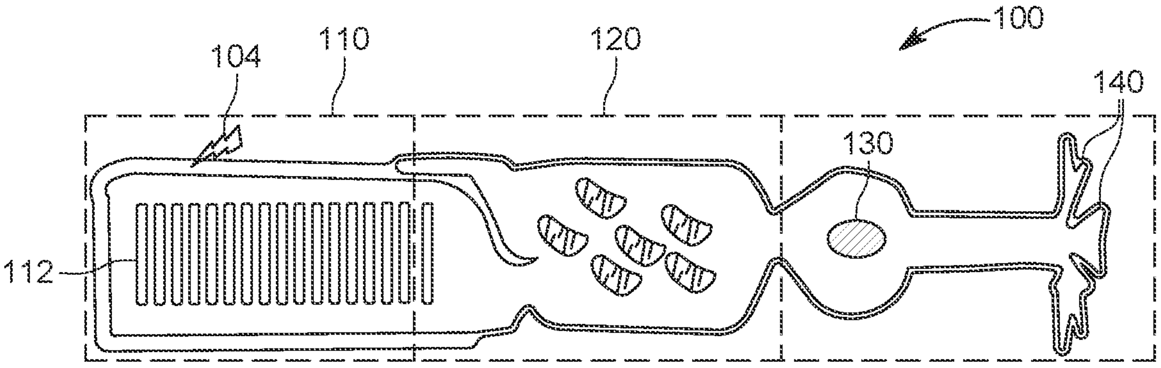
FIGS. 1A and 1B are schematic diagrams of the retina of an eye and a possible sensor that works similar to the retina.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a vision photoreceptor that mimics the retina and is made of hybrid nanocomposites of perovskites (methyl-ammonium lead bromide) and ferroelectric terpolymer (polyvinylidene fluoride trifluoroethylene-chlorofluoroethylene). In one application, the terpolymer may also include other polymers or additives. In yet another application, the terpolymer includes only the three polymers noted above, i.e., the terpolymer consists of these three polymers. However, the embodiments to be discussed next are not limited to these specific materials, but may be applied to other perovskites and/or ferroelectric polymers. Also, the sensors discussed herein can be applied to any system or device that needs a vision sensor, for example, security cameras, drones, submarines, autonomous vehicles, etc.

Reference throughout the specification to “one embodiment” or “an embodiment” means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a light intensity capacitive photoreceptor (CPR) is fabricated that mimics the retina's rod cells. The capacitance of the CPR is dependent on visible light illumination and can lead to the development of security cameras or the artificial retina by integrating with peripheral electronics. The CPR in this embodiment is made from a composite of a perovskite material and ferroelectric terpolymer, which serves as a dielectric in a metal-insulator-metal type capacitor. The prepared composite exhibits photosensitive capacitive behavior at various light intensities in the visible light spectrum due to the chosen perovskite material. In one application, the photoreceptor mimics the spectral sensitivity curve of human photopic vision. The hybrid nanocomposite is stable in ambient air for 129 weeks, with no observable degradation of the composite due to the encapsulation of the hybrid perovskites into the hydrophobic polymer. The proposed photoreceptor is able to recognize handwritten digits (from the MNIST dataset) using an unsupervised trained spiking neural network with 72.05% recognition accuracy. Thus, the proposed vision sensor is suitable for neuromorphic vision applications.

The capacitance of the CPR discussed herein is dependent on the visible light illumination. To fabricate CPRs with excellent light tunable properties, materials that are photosensitive and materials that have tendencies to tune the dielectric properties are used herein. In order to obtain the combination of exceptional optoelectronic and ferroelectric properties, the inventors prepared a hybrid composite of methylammonium lead bromide perovskite ($MAPbBr_3$) and terpolymer polyvinylidene fluoride trifluoroethylene-chlorofluoroethylene (PVDF-TrFE-CFE). It was found that this specific combination of materials has a frequency-dependent capacitance within the range of 1 kHz to 100 kHz. The hybrid perovskites used as fillers in the ferroelectric polymer are capable to modulate the dielectric material's properties proportional to the intensity and wavelength of the incident light. This novel feature of the CPR, i.e., capacitive change with respect to the wavelength of the incident light mimics the spectral sensitivity curve of human photopic vision with the maximum response in the greenish-yellow regime. The photoresponse of these CPRs is reproducible with negligible hysteresis. Furthermore, the fabricated vision sensor is resistive to humidity and oxygen due to the encapsulation of the hybrid perovskites in the hydrophobic ferroelectric terpolymer (FP). The inventors tested the novel CRP and found the longest reported stability of the hybrid perovskites (~129 weeks) owing to their PVDF-TrFE-CFE encapsulation. The proposed vision sensor may be modeled with an RC network and integrated with a novel low power spike oscillator to generate the spike train with a firing rate proportional to the incident light intensity and wavelength (color), as discussed later in more details. The functionality of the proposed CPR and sensing circuit is used to recognize the handwritten digits from the MNIST dataset using an unsupervised trained spiking neural network. The details of this vision sensor and corresponding vision system are now discussed with regard to the figures.

Figure 2:
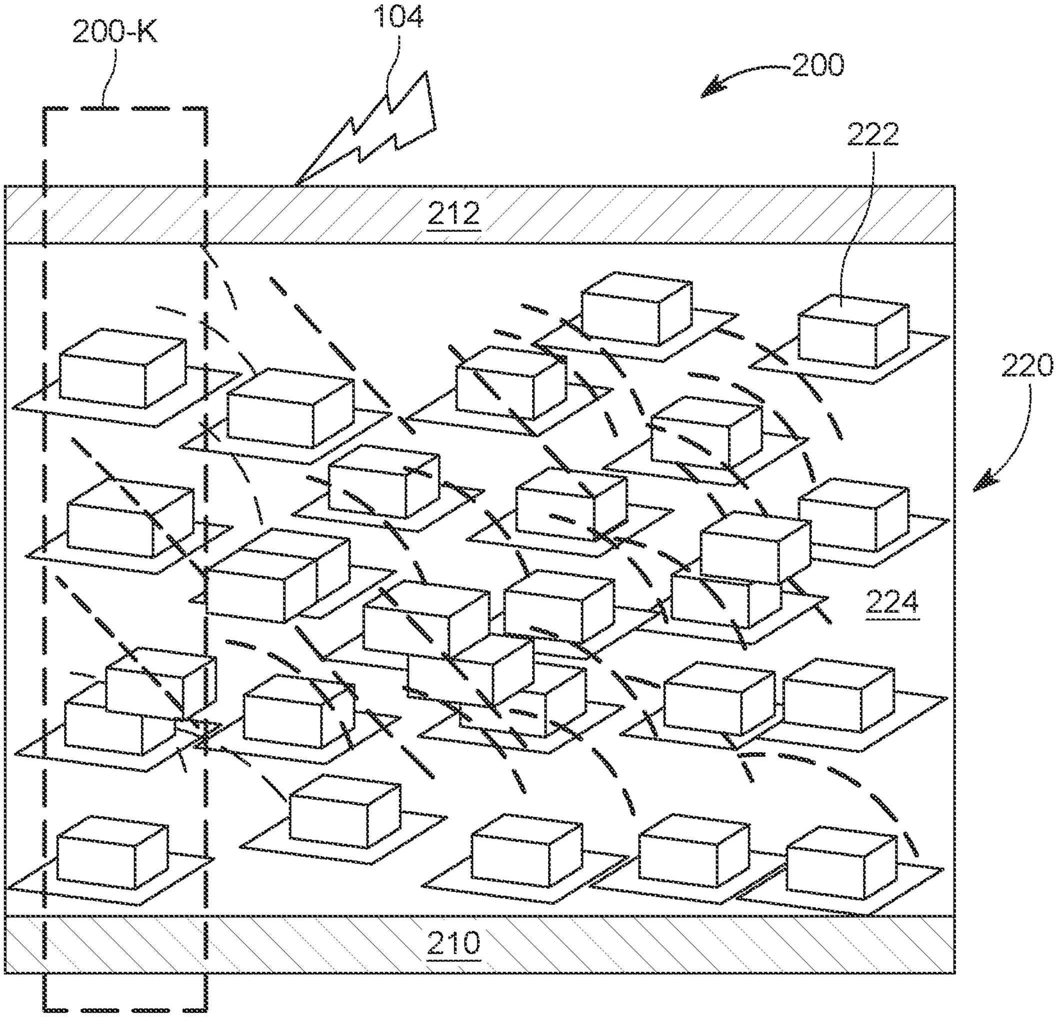
FIG. 2 is a schematic diagram of a capacitive vision sensor that uses perovskites for detecting incoming light.
Figure 3A:
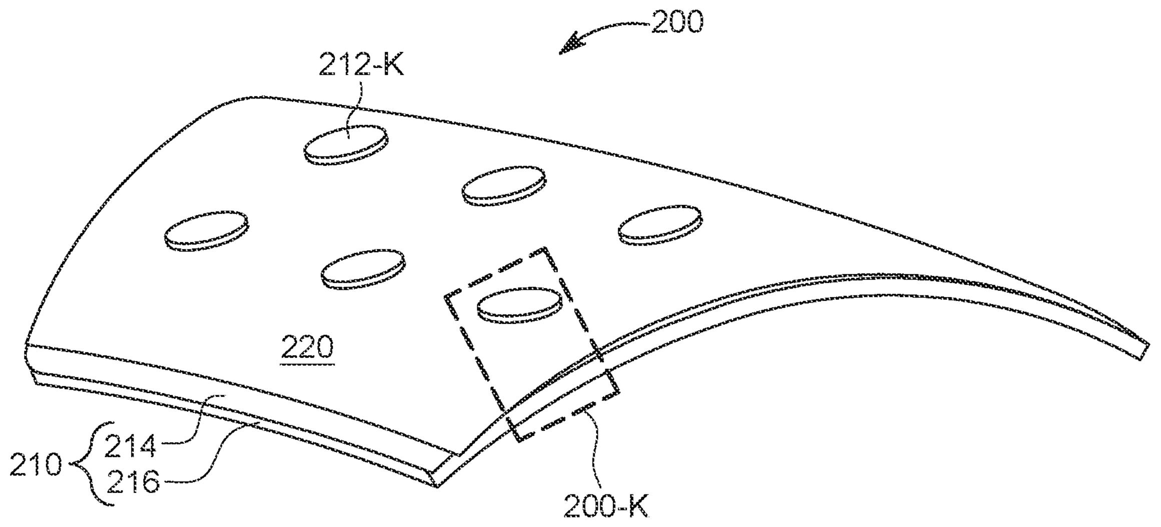
FIG. 3A is a schematic diagram of the capacitive vision sensor of FIG. 2 having a composite material sandwiched between plural electrodes.

The structure of the novel array 200 of CPRs 200$k$ is shown in FIG. 2 and includes a first single electrode 210, a second electrode 212 (which may include plural electrodes separated from each other, as illustrated in FIG. 3A), and a dielectric material 220. The index "k" can be a natural number equal to or larger than 2. In one application, the value of "k" can be in the tens or hundreds for a vision sensor with a surface area if about 1 $cm^2$. The dielectric material 220, which is added as a thin layer between the electrodes, is a hybrid composite that includes the perovskite 222, e.g., methylammonium lead bromide perovskite ($MAPbBr_3$), and the terpolymer 224, for example, polyvinylidene fluoride trifluoroethylene-chlorofluoroethylene (PVDF-TrFE-CFE). Note that a terpolymer is a polymeric material that includes three different polymers. In this case, the three polymers are the polyvinylidene fluoride (PVDF), trifluoroethylene (TrFE), and chlorofluoroethylene (CFE). The perovskite 222 are nanoparticles, i.e., an average diameter of these particles is 500 nm or less. The perovskite nanoparticles are spread throughout the terpolymer 224, as schematically illustrated in FIG. 2. A ratio of the mass of the perovskite particles 222 to the mass of the terpolymer 224 is in the range of 40 to 60% to 60 to 40%. In one application, a first subgroup of the CPRs 200$k$ are using a first ratio, a second subgroup of the CPRs 200$k$ are using a second ratio, different from the first ratio, and so on. Any number of subgroups may be used, for example, three subgroups, one optimized for color green, one for color red, and one for color blue. Other colors may be used. The number of CPRs in a given subgroup may be different from the number of CPRs in another subgroup. For example, the number of CPRs sensitive to green may be double the number of CPRs sensitive to red or blue. In yet another application, these subgroups may include different perovskite in the composite. For example, the first subgroup may be optimized for green and include the $MAPbBr_3$ perovskite, but the second subgroup, which may be optimized for red, may include a iodine-based perovskite material. Thus, each subgroup may have a different perovskite material, which is most sensitive to the selected color.

It is noted that the obtained capacitor array 200 constitutes a flexible capacitive photoreceptor (also called herein the "vision sensor"). In one application, as shown in FIG. 3A, the perovskite ferroelectric nanocomposite (PFNC) 220 (note that the term "dielectric layer" is interchangeably used herein with the terms "PFNC" and "thin layer" and "composite"), is sandwiched between transparent top plural electrodes 212$k$, made of, for example, indium tin oxide (ITO), and a single electrode 210, made of aluminum (Al) 214 coated polyimide substrate 216. Note that in this embodiment, there is a single bottom electrode 210 and plural top electrodes 212$k$ separated from each other, where k is an integer larger than two. Also note that the plural top electrodes 212$k$ cover less than 90% of the top surface of the PFNC 220. In one application, an average diameter (if the electrode is a circle, otherwise an average size) of a top electrode 212$k$ is between 50 to 300 μm. In another application, the average diameter may be as small as 4 to 10 μm. An average distance between adjacent top electrodes 212$k$ is in the micrometer range, for example, 200 μm or less. The plural top electrodes 212$k$ may be uniformly distributed over an entirety of the PNFC 220. Methods for coating the Al on the polymide substrate and depositing ITO islands are known in the art and not repeated herein. A size of the array 200 may be between 1 and 10 mm. In one application, the size of the array 200 may be made as large as desired.

Figure 3B:
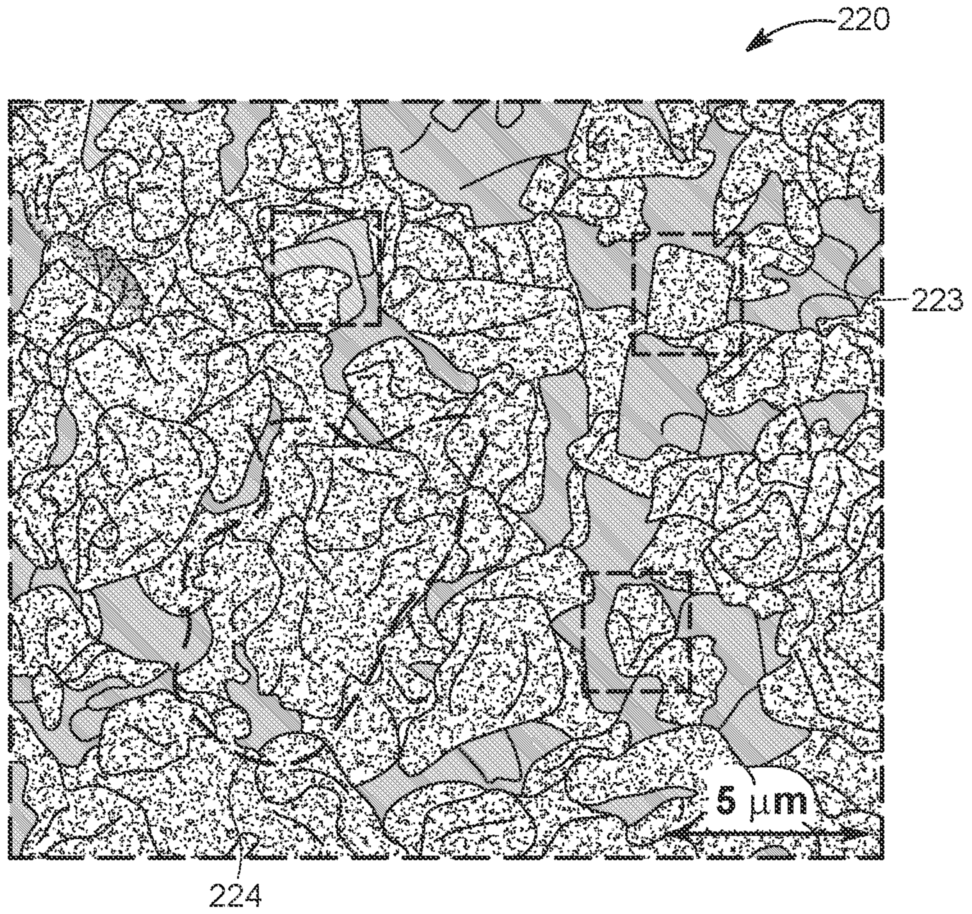
FIG. 3B is a cross-sectional scanning electron microscope image of the sensor of FIG. 3A.
Figure 3C:
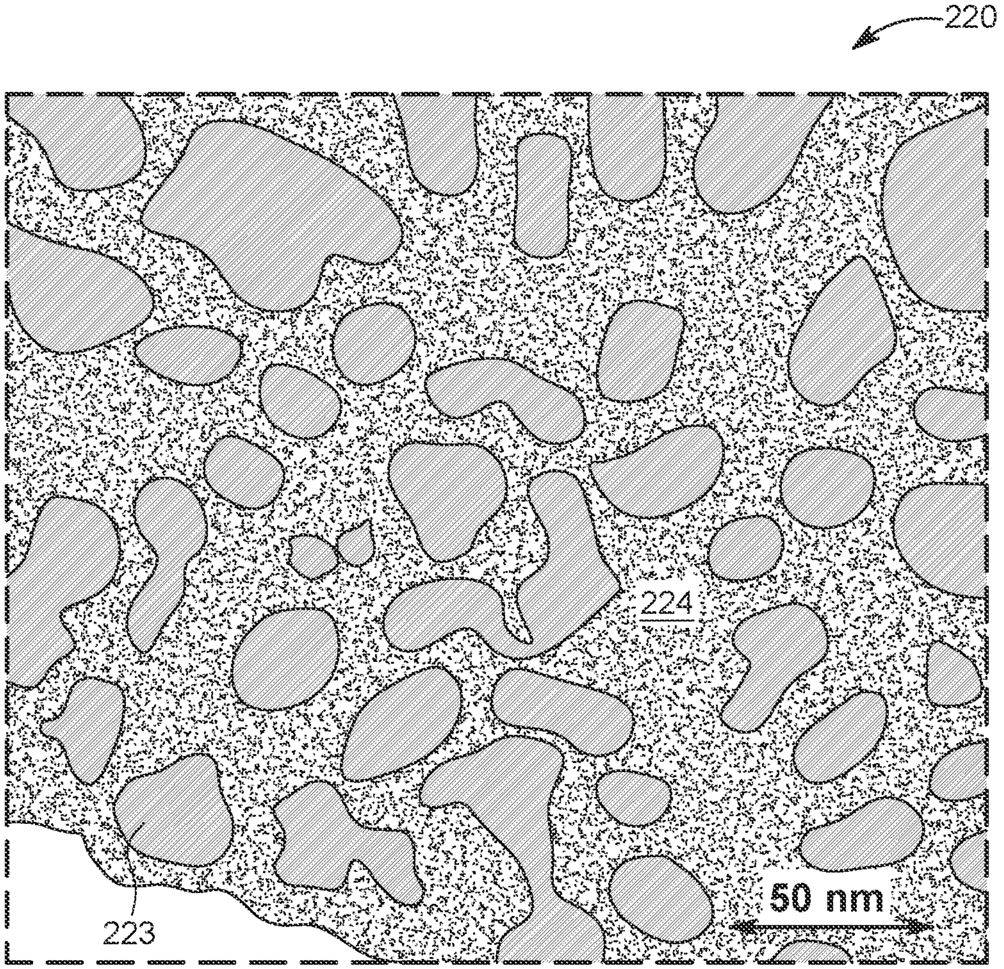
FIG. 3C is a transmission electron microscope image of the composite material of the sensor of FIG. 3A.

The configuration shown in FIG. 3A forms an array 200 of metal-insulator-metal (MIM) capacitors 200$k$. The fabricated CPRs 200$k$ are flexible, i.e., the entire device can be bent as the substrate 216 is flexible and the top electrode 212 is formed on plural islands 212$k$ of ITO. FIG. 3B shows the cross-sectional scanning electron microscopic (SEM) image of the PFNC thin-film 220. It is noted that the perovskite cubic crystals 223 are intermixed within the layers of the PVDF-TrFe-CFE polymer 224. The transmission electron microscopic image (TEM) of the PFNC 220 shown in FIG. 3C depicts the $MAPbBr_3$ nanocrystals 223 embedded in the ferroelectric polymer (FP) 224. The X-ray diffraction pattern (not shown) reveals the purity of perovskite crystals 223 in the composite 220, which was undisturbed in the polymer 224. The signature peaks further confirm the cubic structure of the $MAPbBr_3$ perovskite crystals in the PVDF-TrFE-CFE FP.

Figure 4:
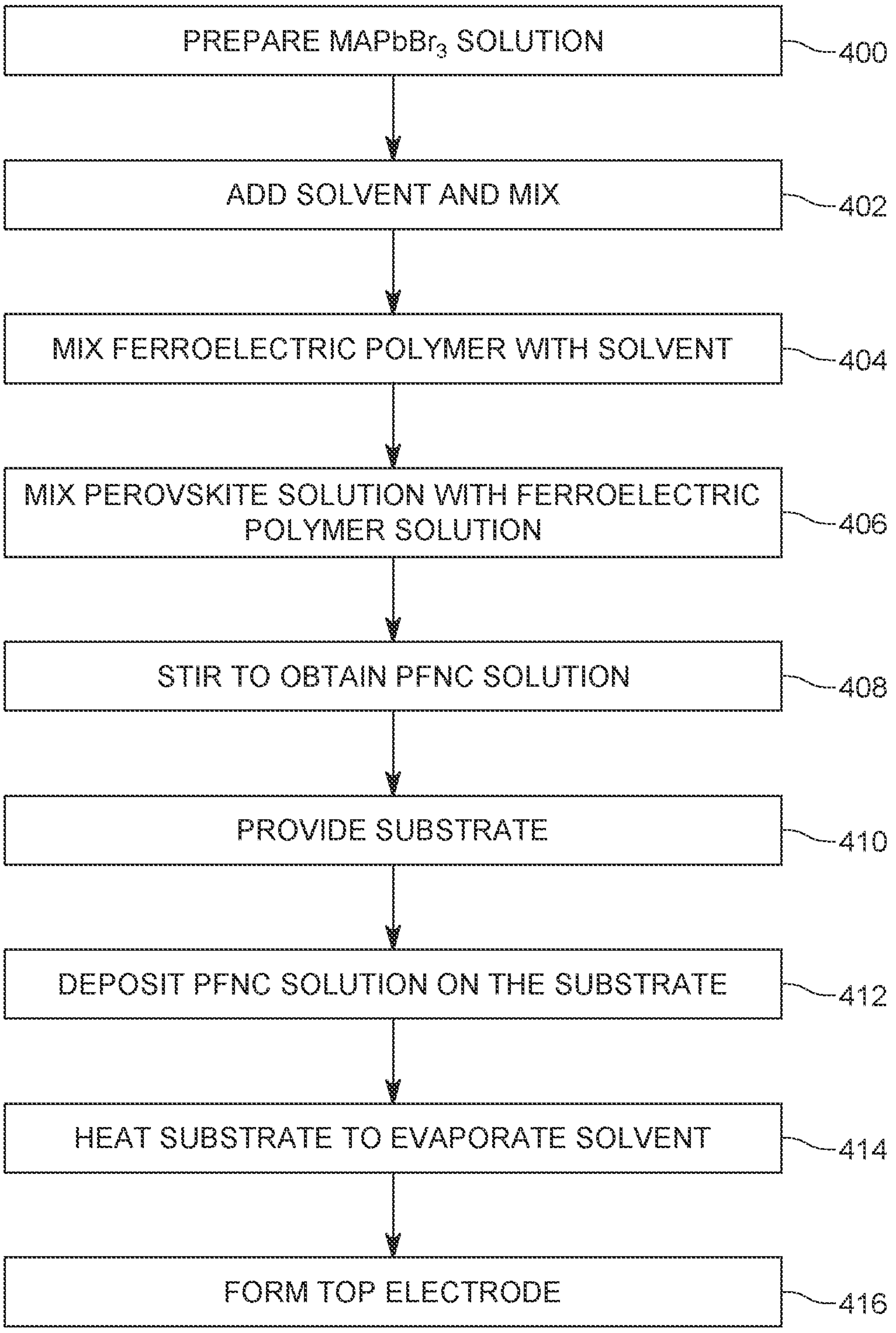
FIG. 4 is a flow chart of a method for making the capacitive vision sensor of FIG. 3A.

A method for forming the CPRs array 200 is now discussed with regard to FIG. 4. In step 400, 0.5M $CH_3NH_3PbBr_3$ ($MAPbBr_3$) solution was prepared from the commercial methyl ammonium bromide ($CH_3NH_3Br$) and lead bromide ($PbBr_2$). This mixture was added in step 402 to N, N Dimethylformamide (DMF) solvent and ultrasonicated for 24 hours. In step 404, 100 mg of commercial ferroelectric polymer PVDF-TrFE-CFE was stirred constantly in 1 ml of DMF solvent for 24 hours. The final PFNC solution was prepared by mixing in step 406 1 ml of the FP solution with 1 ml of the $MAPbBr_3$ solution. The mixture was stirred constantly for 24 hours in step 408 to obtain a homogenous PFNC solution. In step 410, an aluminum-coated Kapton Polyimide sheet 210 was provided and this sheet serves as the flexible substrates for flexible CPRs and as the bottom electrode. In step 412, 300 μL of the PFNC solution was drop-casted on the square-shaped (e.g., 2×2 $cm^2$) Al coated polyimide sheet 210 pasted on a carrier substrate to form the PFNC thin-film 220. In one application, the Al coated polyimide sheet 210 is circle-shaped or any other shape. In another application, the Al may be replaced by another metal. The area of the sheet 210 may be as small or as big as desired and as appropriate for the desired application.

The substrate was heated in step 414 under vacuum for 3 h at 90° C. for solvent evaporation. In step 416, a 120 nm thick transparent indium tin oxide (ITO) was RF sputtered on the PFNC thin-film 220 using a shadow mask for the top electrode (e.g., 3 mm circular form) 212*k*. Other materials, sizes, shapes or geometries may be used for forming the top electrode. It was observed that by adding the $MAPbBr_3$ solution as filler in the FP solution, the phase angle could be tuned to be frequency-independent, as reported for semiconducting fillers in the FP solution. The final weight percentage of FP 224 and $MAPbBr_3$ 222 solutions of PFNC 220 was optimized to get a frequency-independent phase angle under the dark condition, e.g., between 40 to 60% by weight for the amount of $MAPbBr_3$ in the FP. A similar process can also be followed for a rigid metal-coated Silicon substrate, and the flexibility can be achieved through the soft-backside etch of the silicon substrate. Other materials may be used for the substrate.

Figure 5:
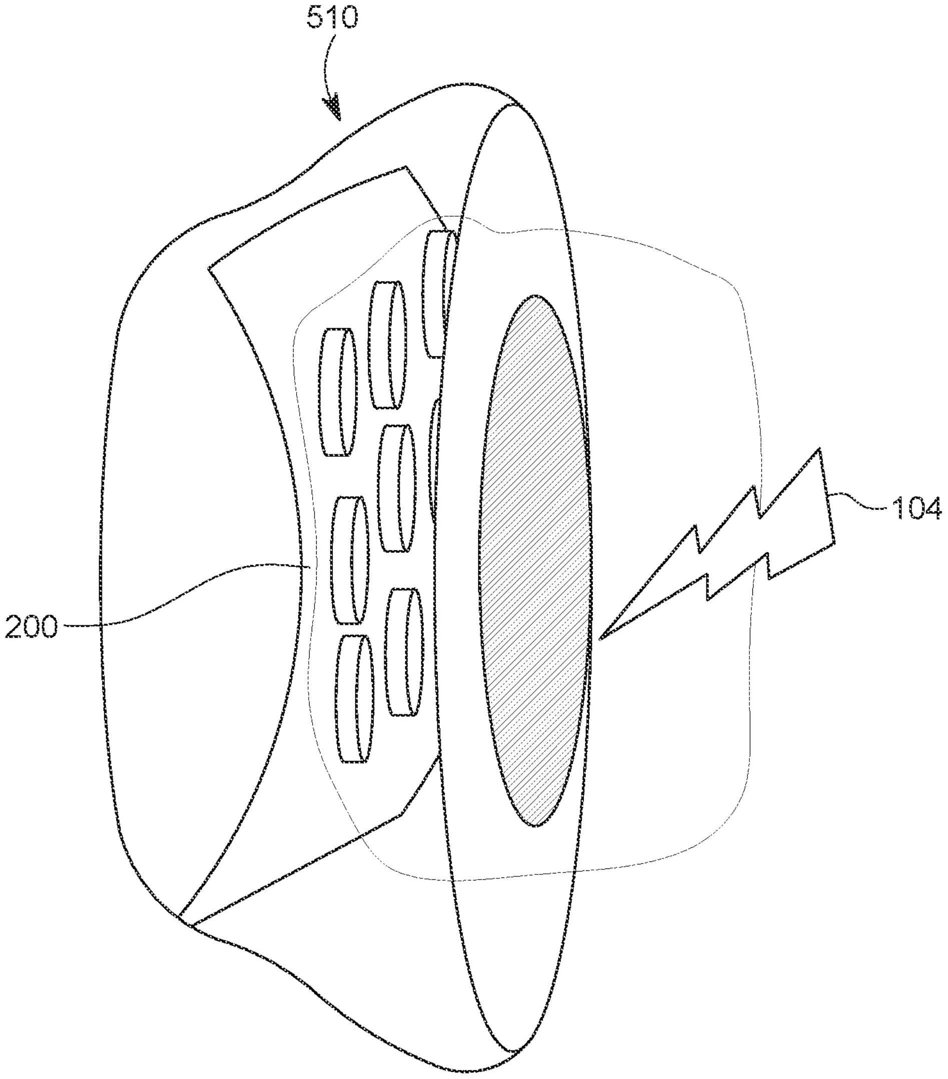
FIG. 5 illustrates one possible implementation of the capacitive vision sensor of FIG. 3A as an artificial retina.

The possible implementation of the array 200 of flexible CPRs 200*k* as the retina of the eye 510 is shown in FIG. 5. Due to its flexible properties, the fabricated array 200 can be shaped into any desirable shape using simple origami techniques. For instance, the inventors have shaped the array 200 into a hemispherical shape in this embodiment to mimic the eye 510. The array 200 may also be used for a vision device, e.g., a camera, as discussed later.

Figure 6A:
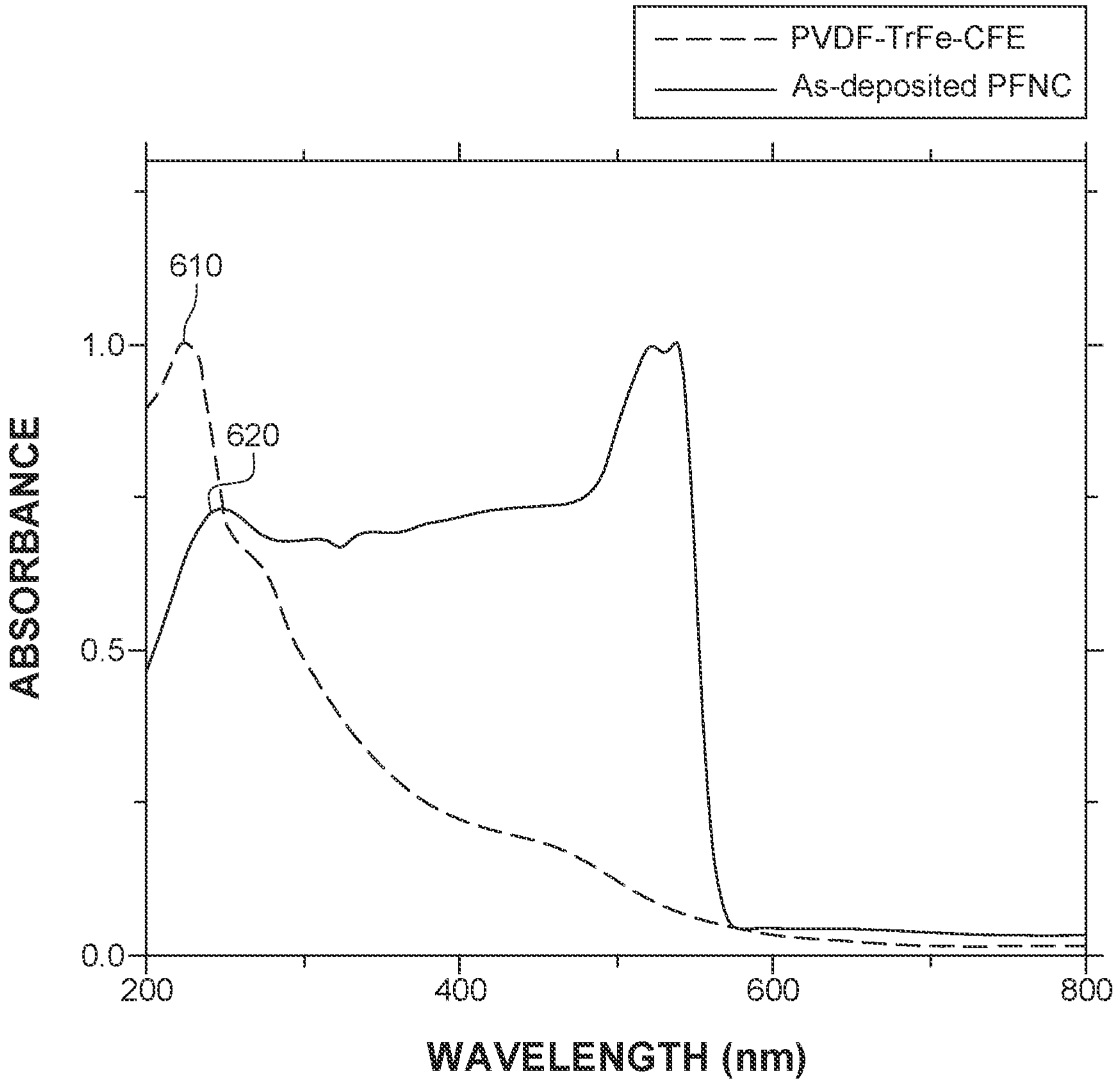
FIG. 6A illustrates the UV-visual absorbance spectra of the composite material of the sensor of FIG. 3A.
Figure 6B:
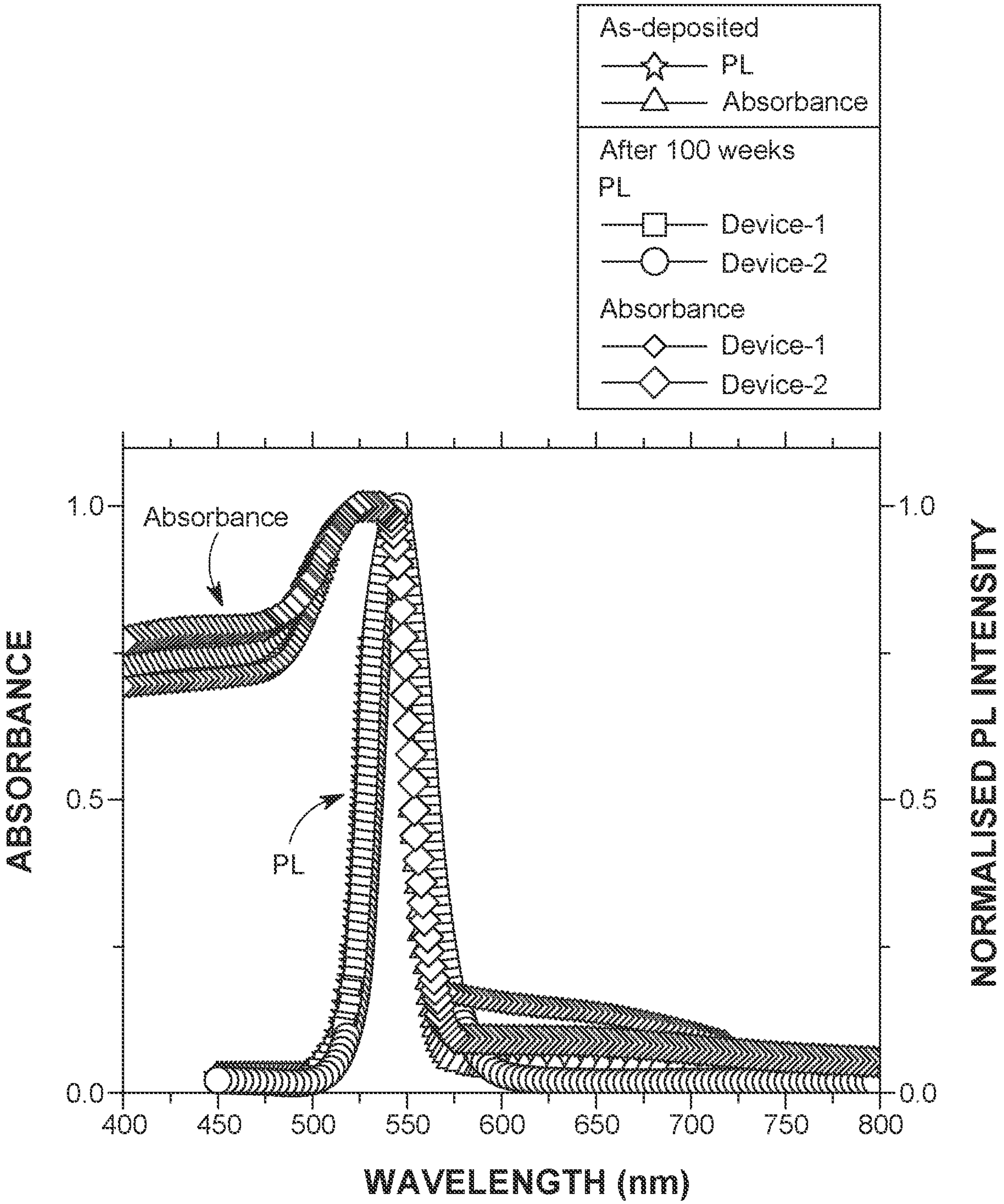
FIG. 6B illustrates the absorbance and photoluminescence spectra of the composite material of the vision sensor of FIG. 3A and various experimental sensor using that composite material after 100 weeks since fabrication.

The photosensitivity of the array 200 of CPRs 200*k* is now discussed. The ultraviolet-visible (UV-VIS) spectra of the as-deposited PFNC 220 and pure FP thin-films (these films are made with no perovskite materials, i.e., their chemical composition is pure PVDF-TrFE-CFE and they are used for reference) are shown in FIG. 6A. The PFNC composite 220 exhibits absorbance in the UV and part of the visible regime. The pure PVDF-TrFE-CFE thin-film has a peak absorbance 610 near 200 nm, and a relatively weak absorbance in the visible regime (400 nm to 500 nm). From the spectra of both samples, it can be seen that the peak 620 near ~200 nm in the PFNC 220 corresponds to the FP thin-film. The broad absorption of the PFNC thin-film 220 until 563 nm in the visible regime is attributed to the $MAPbBr_3$ nanocrystals 223. The PFNC composite 220 exhibits strong photoluminescence (PL) due to the presence of $MAPbBr_3$ nanocrystals in the ferroelectric polymer, as shown in the PL spectra of FIG. 6B. The band-edge cutoff for the PFNC composite 220 is ~2.2 eV (λ=563 nm).

These characterization studies indicate that the PFNC 220 is light-sensitive. Therefore, fabricated sensors were characterized under controlled light conditions. The sensor characterization and mechanism study were performed by measuring the magnitude of the impedance (|Z|) and phase angle under dark and under various light intensities, generated by multiple commercial light-emitting diodes (LEDs). From previous studies, it is known that semiconducting fillers in the ferroelectric polymers exhibit frequency-independent behavior in the frequency range of 1 kHz to 100 KHz [15]. Because of this, all the measurements discussed herein were limited to this range.

Figure 7A:
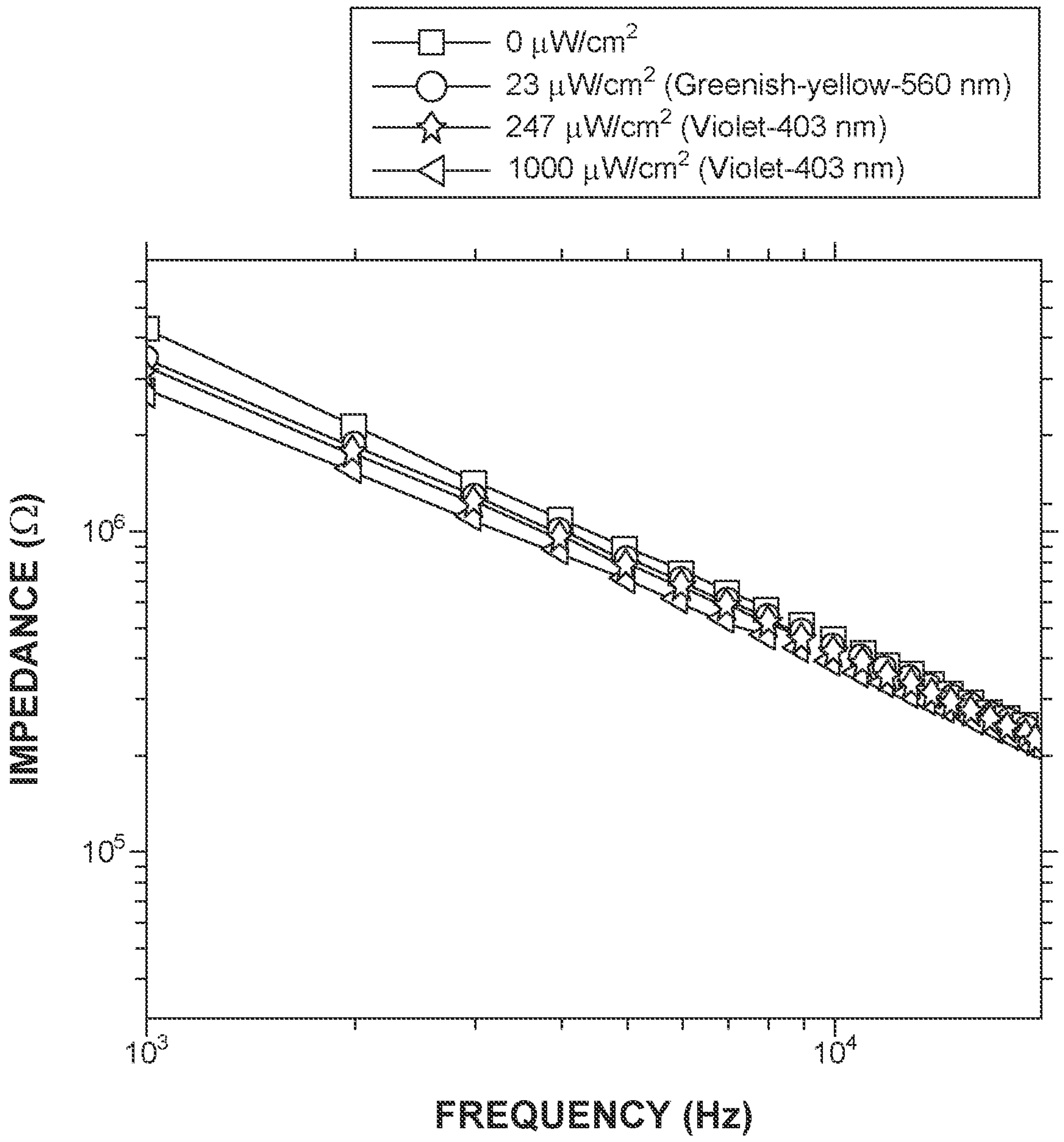
FIG. 7A shows the impedance of the capacitive photoreceptors (CPRs) of the vision sensor corresponding to the change in light intensities applied by various LEDs.

The electrical behavior of the CPR array 200 under light illumination is now discussed. The CPR array 200 with PFNC 220 is very sensitive to light due to the presence of $MAPbBr_3$ nanocrystals 223 in the nanocomposite. The fabricated CPR array was illuminated at different intensities using different commercial LEDs in the visible spectrum: violet ($\sim\lambda_{peak}$=403 nm), green ($\sim\lambda_{peak}$=520 nm), greenish-yellow ($\sim\lambda_{peak}$=560 nm), yellowish-orange ($\sim\lambda_{peak}$=590 nm), and red ($\sim\lambda_{peak}$=630 nm). The beam profile and the intensities of these LEDs were homogenized using a custom-built setup. FIG. 7A, which plots the impedance of the CRP array 200 corresponding to the change in the illumination light for various frequencies shows that even for a slight variation in the greenish-yellow LED intensity, the impedance of the CPR is decreasing significantly. The Nyquist impedance plot shown in FIG. 7B for different light intensities (3 LEDs) indicates that the CPRs exhibit frequency-independent behavior. The capacitance of such sensors that exhibit frequency-independent behavior is called pseudo-capacitance ($C_a$), which was estimated from the impedance and phase angle of the device. The $C_a$ of the CPR array 200 increased with the increasing of the light intensity, and the frequency-independent behavior at each light condition is further evident in the capacitive response shown in FIGS. 7C and 7D. Thus, within the frequency range of 1 kHz to 100 kHz, the CPR array 200 acts as a light tunable constant phase element (CPE).

Figure 7B:
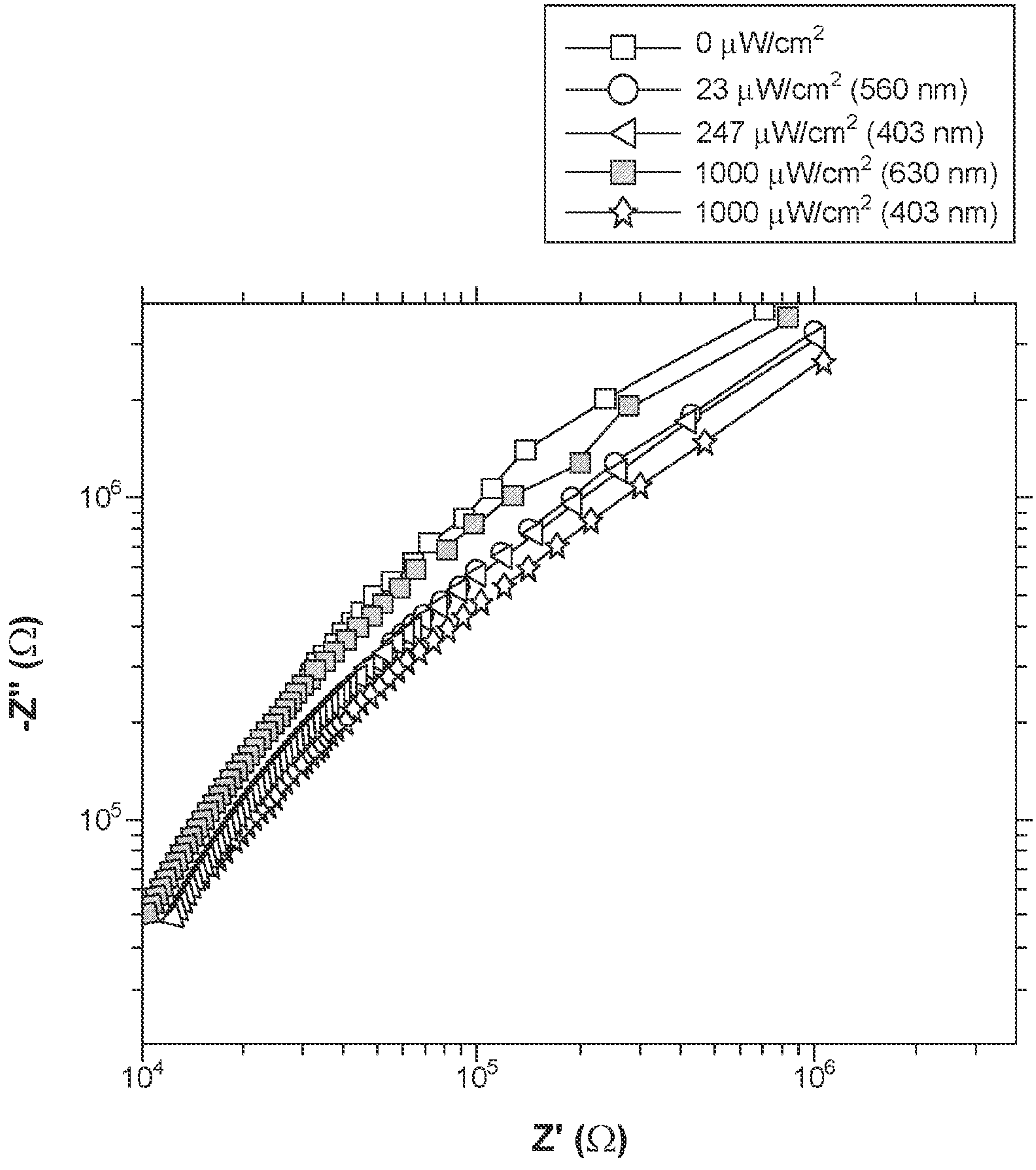
FIG. 7B shows the Nyquist impedance plot of the CPRs indicating the frequency-independent behavior.
Figure 7C:
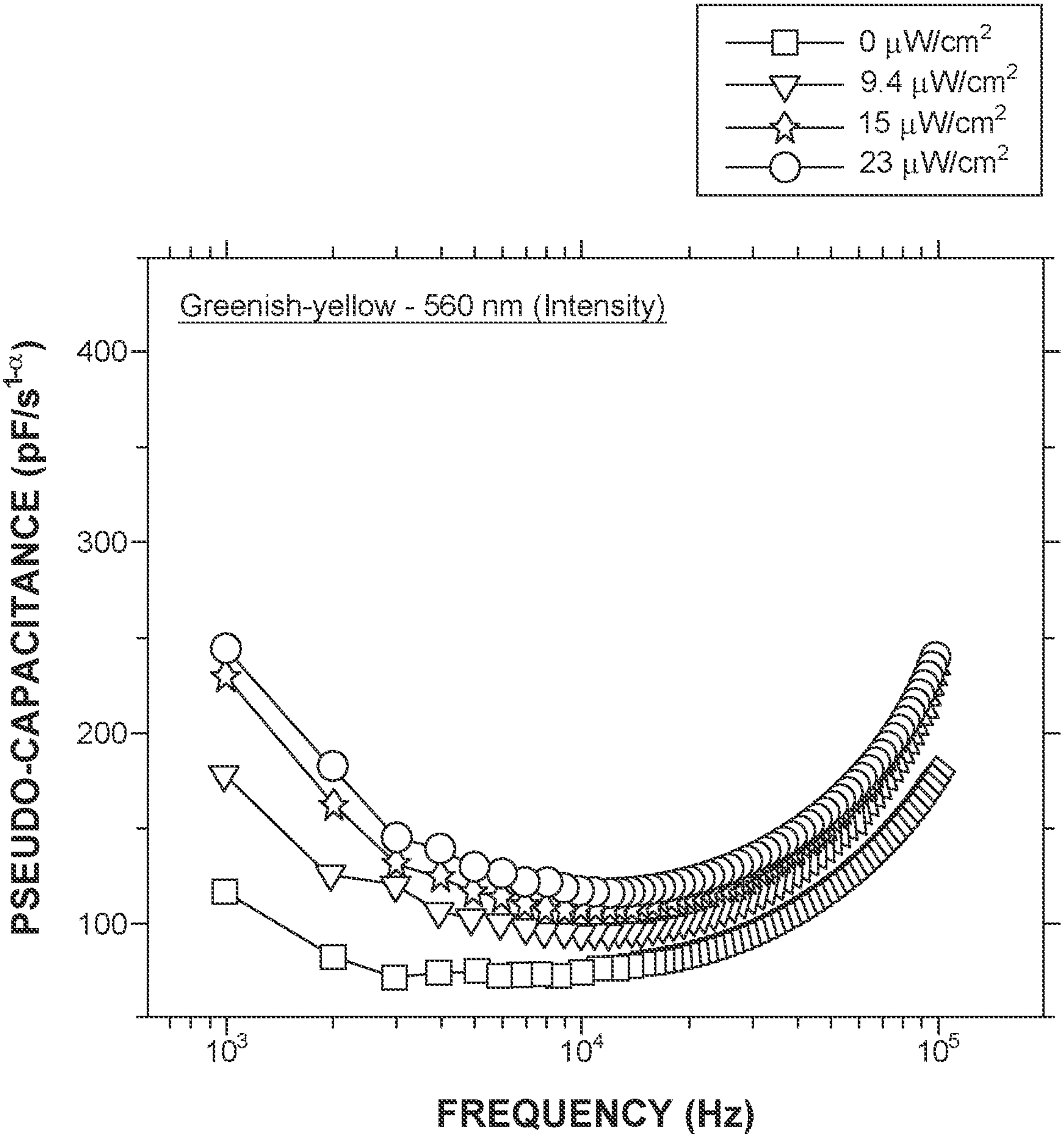
FIG. 7C shows the pseudo-capacitance variation under the illumination with greenish-yellow LED and FIG. 7D shows the same capacitance variation under various LEDs of different intensities.
Figure 7D:
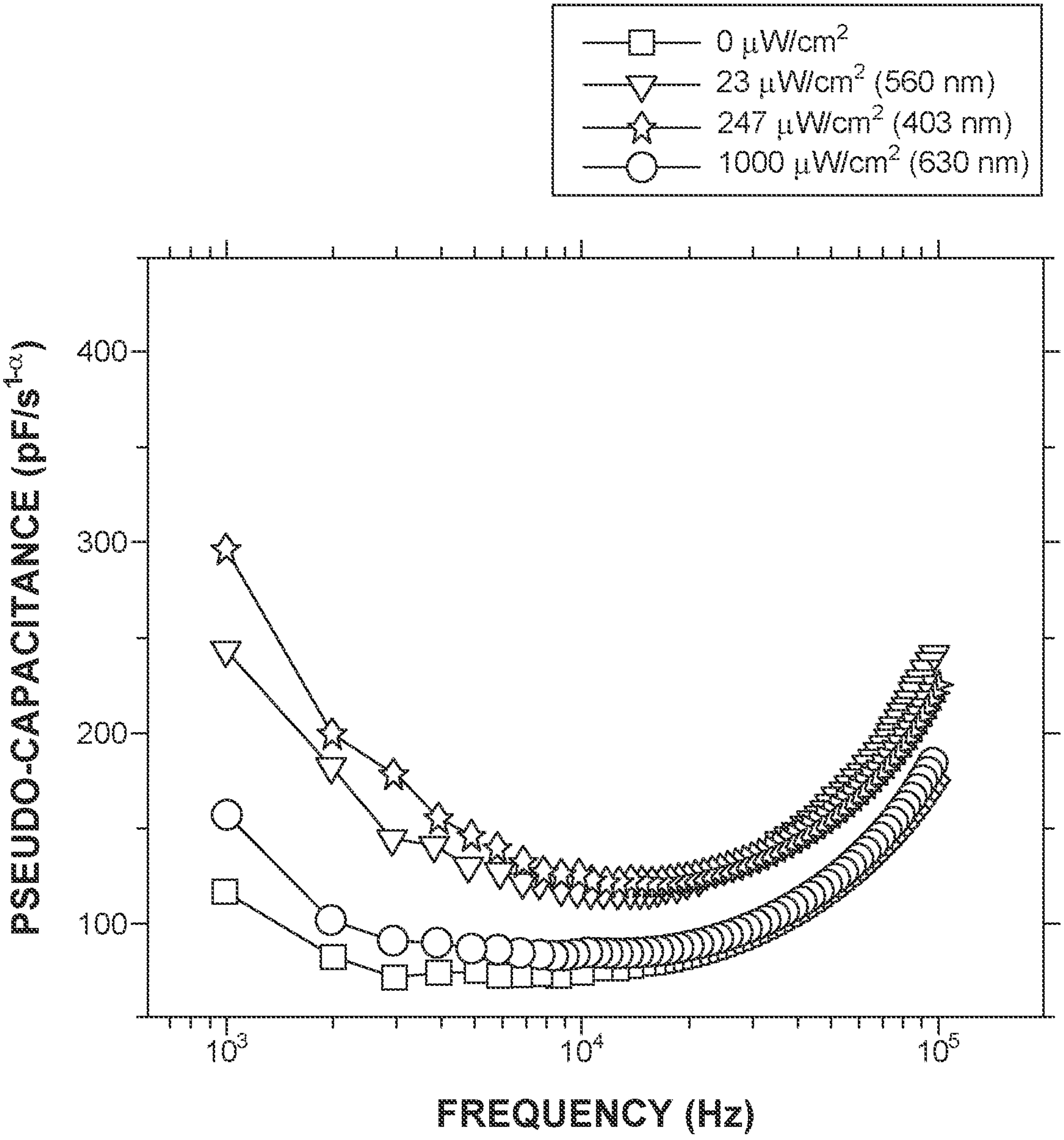

The response of multiple CPRs illuminated with 23 μW/$cm^2$ greenish-yellow light is overlapped with the response of the array illuminated with 247 μW/$cm^2$ violet light, as also illustrated in FIGS. 7A, 7B and 7C. The capacitive response of the array is higher in the case of greenish-yellow light when compared to violet or red, which indicates that the composite material 220 is more sensitive to the greenish-yellow light. The higher sensitivity in the greenish-yellow regime is due to the maximum absorbance of the composite in this regime (as discussed above with regard to FIG. 6A). However, note that a change in the type of the used perovskite changes the light sensitivity of the array 200, as discussed above with regard to the possibility of having various subgroups of CPRs that are sensitive to different light wavelengths. When the array was illuminated with the red LED even at 1000 ρW/cm$^2$, the change in the pseudo-capacitance $C_a$ is negligible, and the absorbance of the composite is almost negligible. The observed electrical response is in-line with the discussed UV-VIS and PL spectra of the PFNC composite 220. The capacitive response was measured under other LEDs, and the obtained Nyquist impedance plots (not shown) further indicate that the CPRs' response is sensitive to the wavelength and intensity of the light. Similar to the photoreceptors in the retina, which induce a membrane potential change upon varying the light intensity, the capacitance of the CPR 200*k* is found to be variable with the light intensities.

Figure 8A:
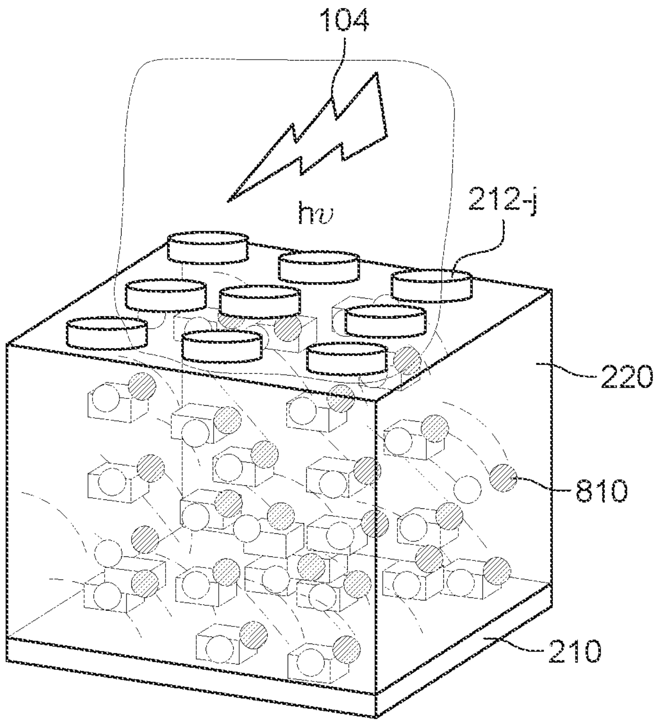
FIG. 8A is a schematic illustration of photo-generated carriers in the composite of the vision sensor and FIG. 8B is a schematic illustration of varying dielectric properties in a CPR, influencing its fractional order impedance upon light illumination.
Figure 8B:
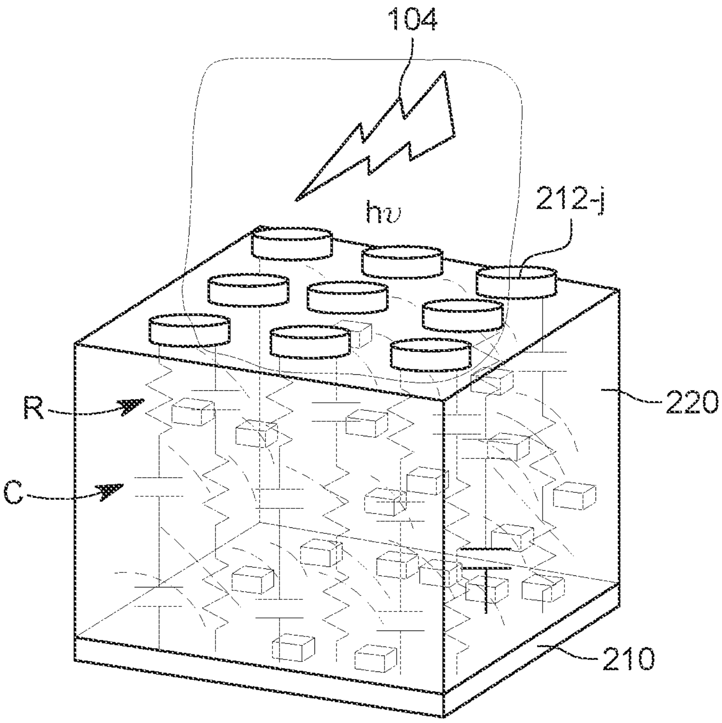

The trend in the variation of Z and $C_a$ for the CPRs indicates that there is an increase in the conductivity of the dielectric medium due to the photo-generated charge carriers 810, as schematically illustrated in FIG. 8A. The equivalent circuit, representing the frequency-independent behavior, can be modeled as RC ladder circuits connected in parallel, as shown in FIG. 8B. The model illustrates the photosensitive impedance change in the CPR array 200. In the dark condition, the capacitance density is about 1 nF/cm$^2$. Achieving capacitance densities comparable to the biological membrane capacitances is challenging with the existing CMOS scaling and technology. The higher baseline capacitance density in the PFNC 220 is due to the ferroelectric electric properties of the FP 224 in the composite.

Halide perovskites are highly sensitive to polar molecules such as water and oxygen, owing to their ionic nature. This results in the phase transition of the perovskites, which eventually leads to poor optical performance. Hence, the stability of these perovskites in the air ambience is poor. A degradation study of perovskites can be performed using photoluminescence (PL) spectroscopy. The phase transitions, which are the indications of degradation, results in the peak broadening or shift. It is observed that even after 100 weeks of aging, there is neither a significant linewidth broadening nor a peak PL wavelength shift in the PL spectra shown in FIG. 6B of the array 200 employing the PFNC composite 220. The arrays 200 used for the stability studies were kept in a petri dish and stored in the ambient air (room temperature ~23° C. and ~40% RH humidity). These tests indicate that the composite 220's performance is very stable, and there is no degradation of $MAPbBr_3$ nanocrystals 223 as they are encapsulated in the PVDF-TrFE-CFE polymer 224. Since the PVDF polymers are more hydrophobic, the PFNC 220 is more resistant to oxygen and moisture absorption. The absorbance spectra are also undisturbed, as noted in FIG. 6A, as the arrays stored for a period of time still absorb the light similar to the arrays freshly made. It was also noted that the response measured for LED illumination after 100 weeks of storage of the arrays 200, and the freshly made arrays are similarly responsive to the light, as discussed earlier. Stability is not an issue anymore in the case of the PFNC 220. Thus, the novel array 200 addressed a significant shortcoming of the existing perovskite devices.

Figure 9:
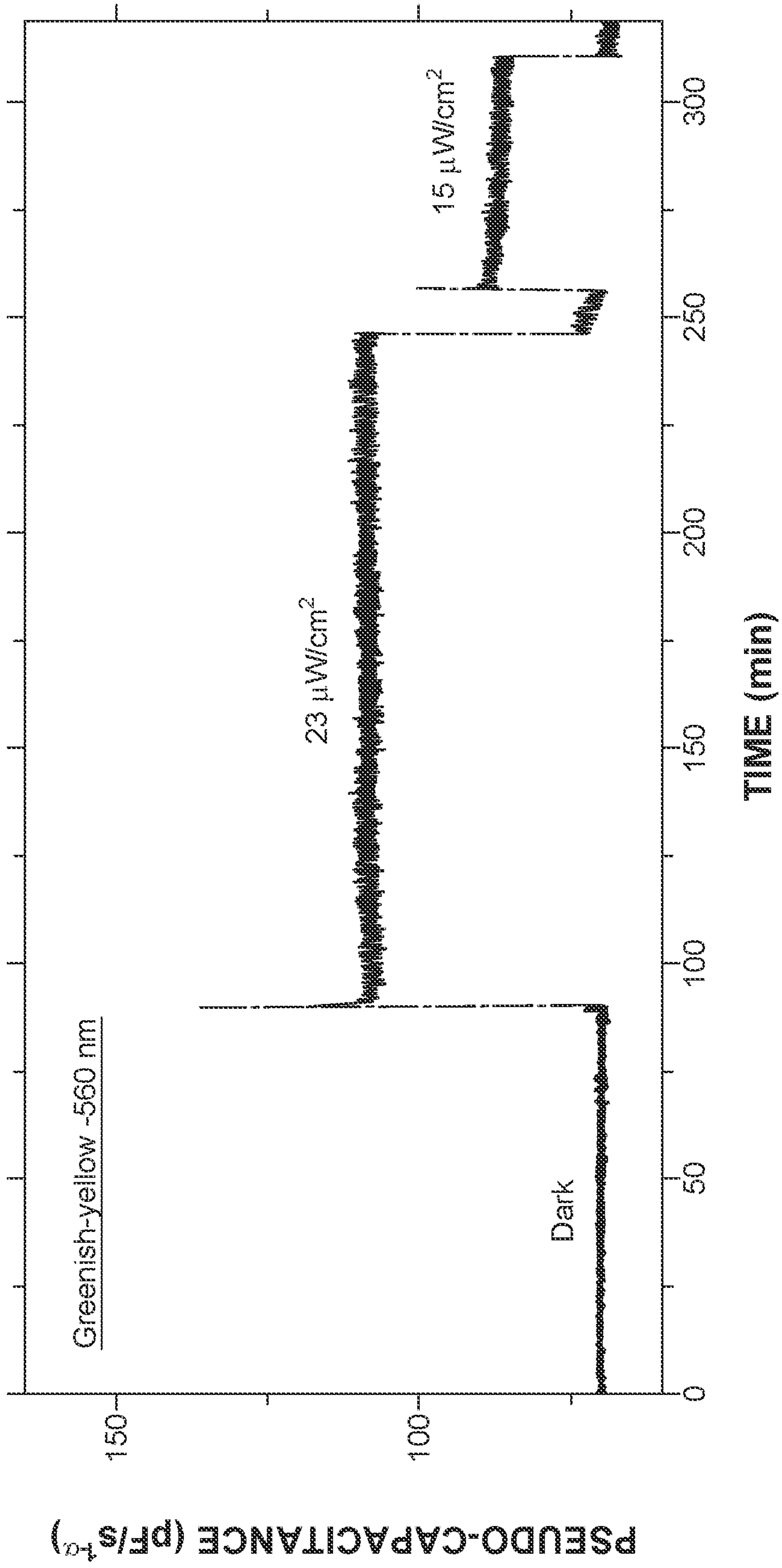
FIG. 9 illustrates the response of a CPR, which shows stability under dark for a long time.
Figure 10A:
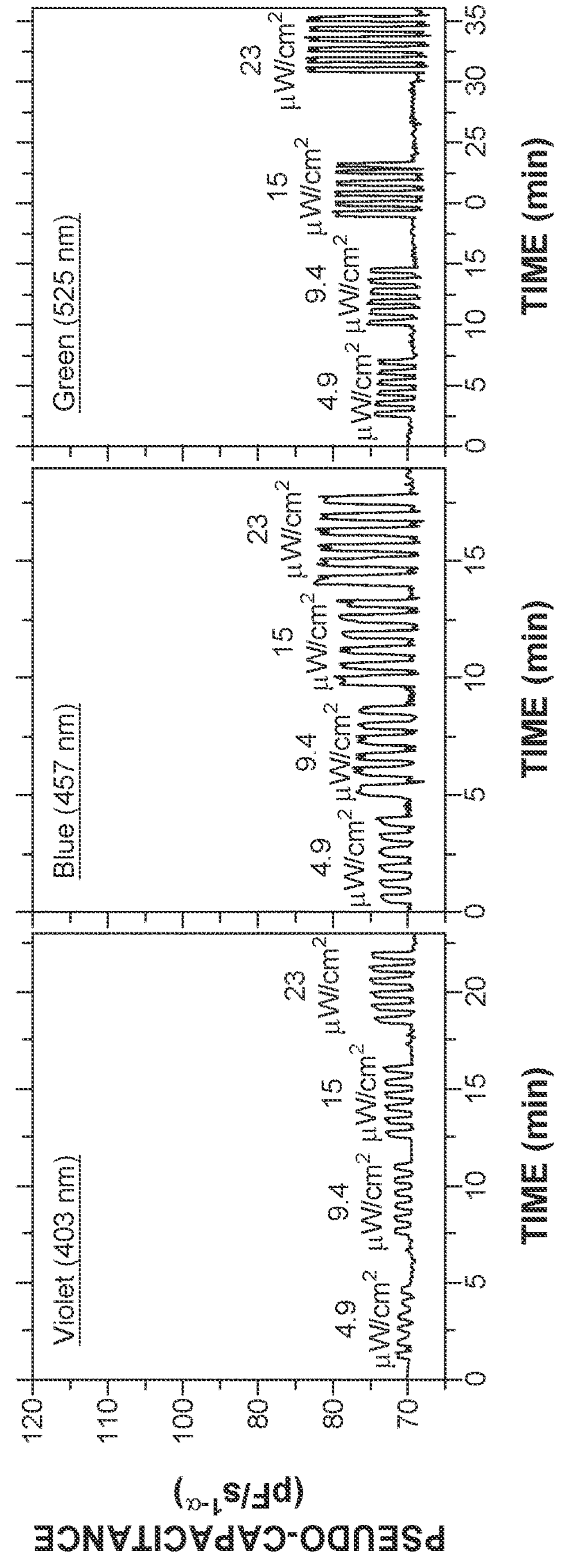
FIGS. 10A and 10B show the transient response of the CPRs under the illumination of LEDs at various intensities, indicating the tunable and reproducible properties of the CPRs (measured at 10 kHz)
Figure 10B:
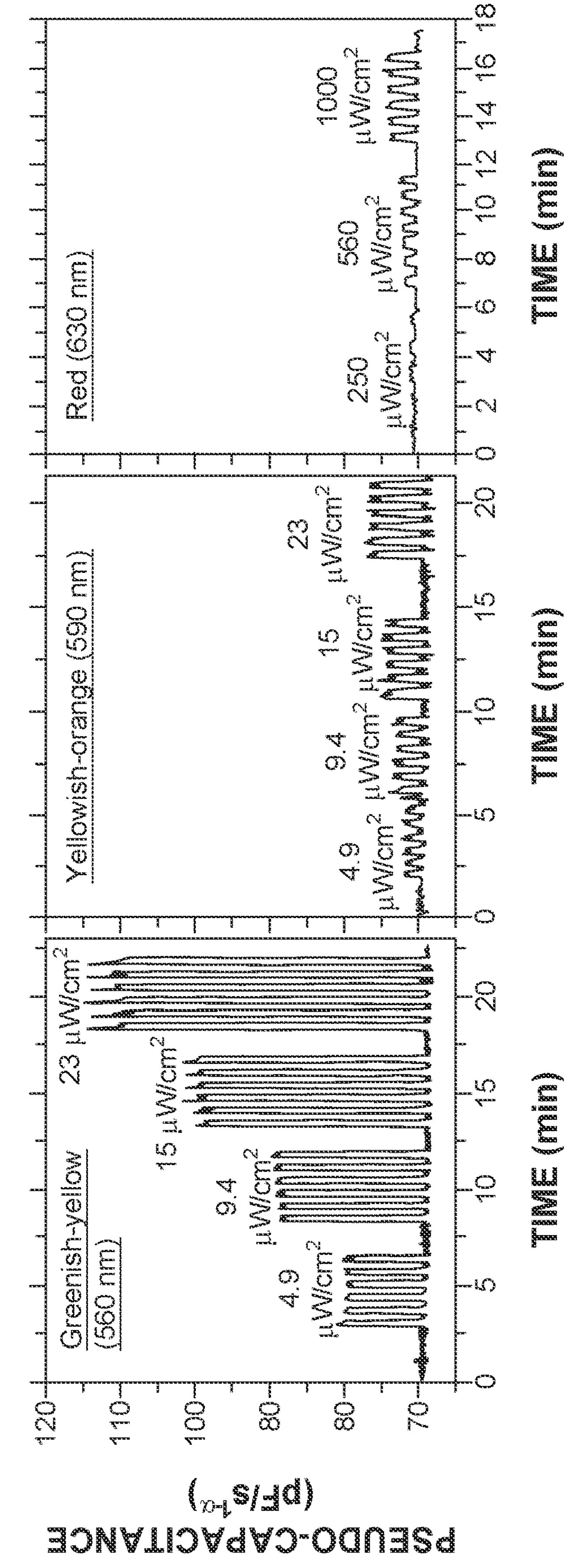
Figure 11A:
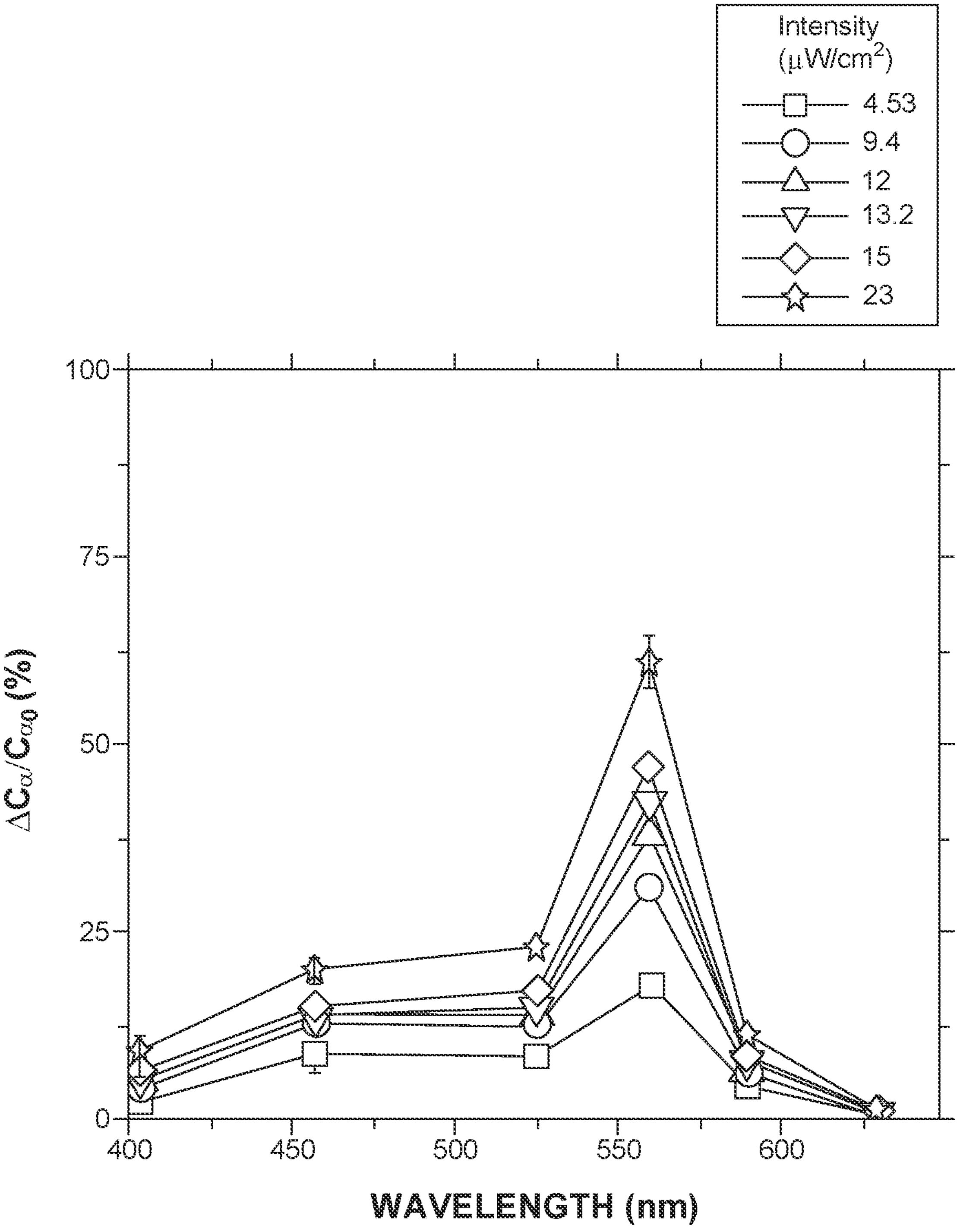
FIG. 11A shows the variation in the pseudo-capacitance to various exciting light wavelengths.

The proposed CPR array 200 shows high electrical stability in the dark condition. Tests performed for the $C_a$ at 10 KHz for a long time show a negligible deviation from the baseline, as noted in FIG. 9. In order to understand the transient and the repeatable behavior of the CPR array upon illumination, the LEDs were modulated with voltage pulses (pulse width ~20 s) and the $C_a$ of multiple devices was measured under the illumination with the plural LEDs. The transient response of the CPR array excited with multiple LEDs at various intensities is shown in FIGS. 10A and 10B. From these measurements, it can be seen (1) that the $C_a$ is modulated according to the incident light intensity, (2) the CPR arrays exhibit a baseline capacitance in the dark conditions, and (3) the presence of a step response of the array with the light pulse. The varying intensity of the LEDs is reflected in the varying $C_a$ magnitude of the CPR arrays. The extent of variation in the $C_a$ is also dependent on the exciting light's wavelength. The change in $C_a$ (see below equation (1)) of the CPR array at various wavelengths in the visible spectrum is shown in FIG. 11A. The CPR arrays exhibits a maximum response in the greenish-yellow regime due to the maximum absorbance of the PFNC composite 220 in this regime, as discussed earlier. Advantageously, the spectral density curve of the human eye's photopic vision has a similar response to colors as the CPR array 200. This shows that the novel composite 220 is a very good candidate to mimic the capabilities of the human eye:

$$\frac{\Delta C_\alpha}{C_{\alpha 0}}\% = \frac{C_\alpha(\text{under light}) - C_{\alpha 0}(\text{under dark})}{C_{\alpha 0}(\text{under dark})} * 100 \quad (1)$$

Figure 11B:
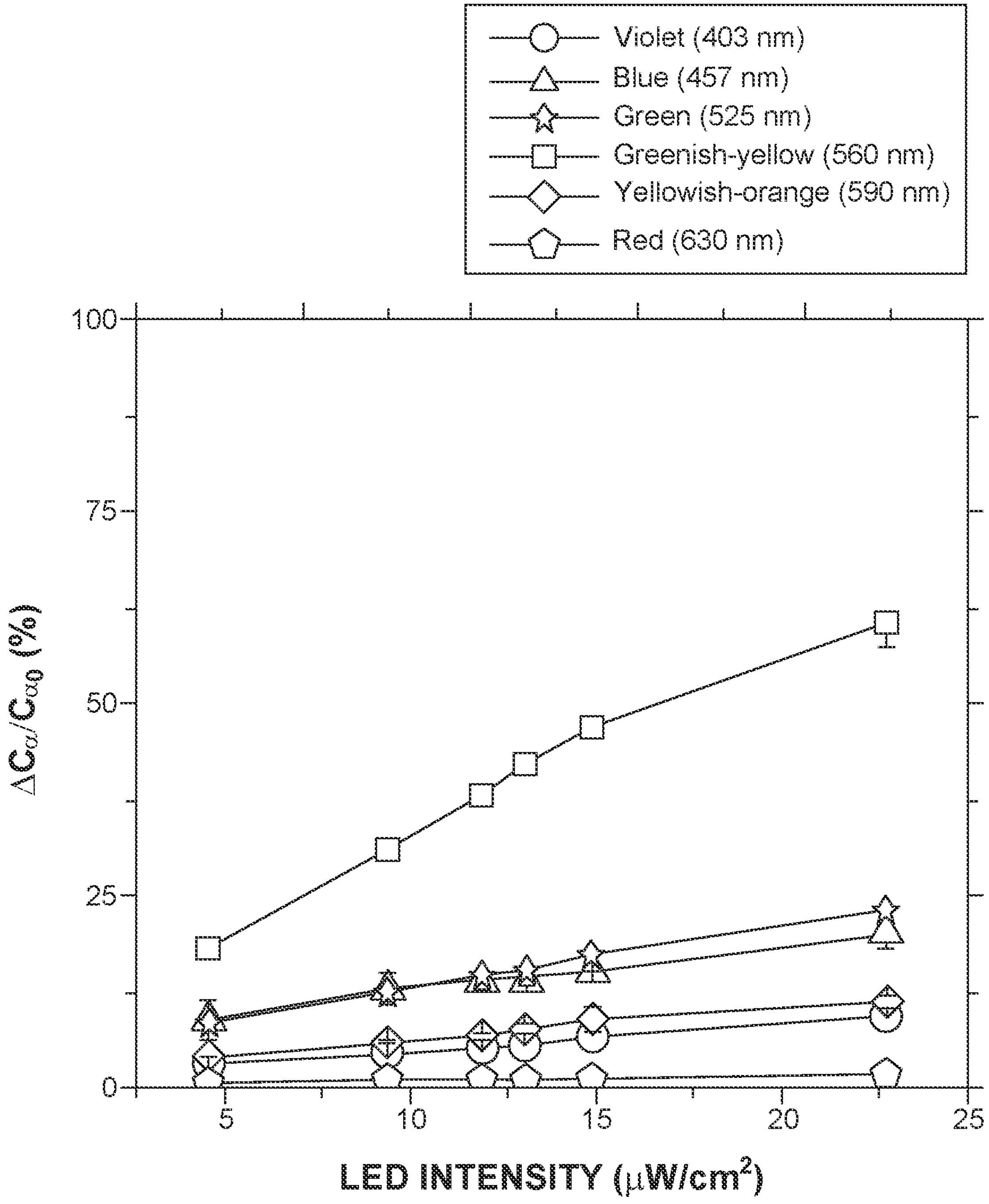
FIG. 11B shows the linear response of multiple CPRs proportional to the intensity of the light, and it shows the higher sensitivity to greenish-yellow light (560 nm)
Figure 11C:
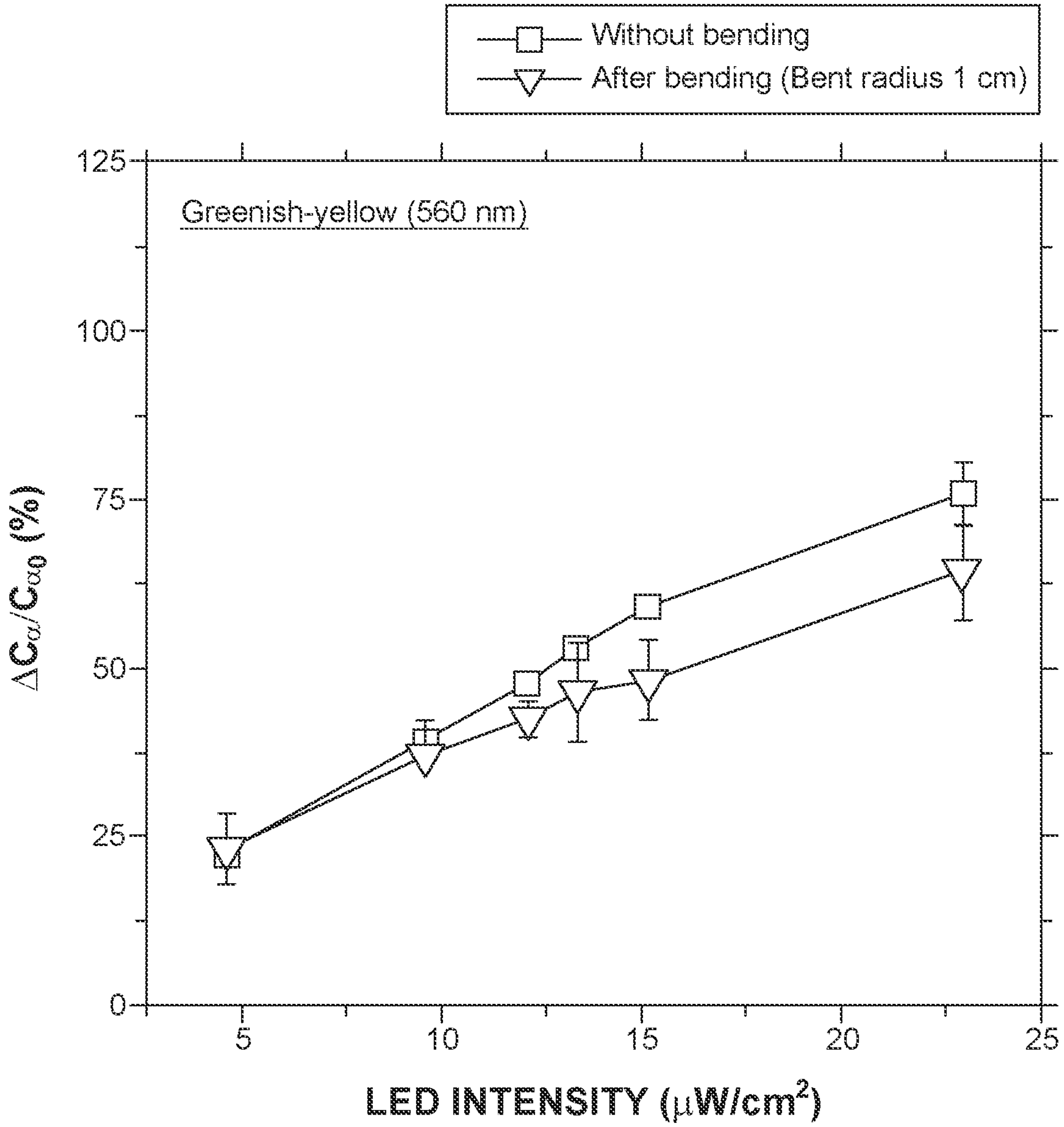
FIG. 11C shows the response and performance of flexible CPRs without bending and after bending (bent radius ~1 cm)

The response of the CPR array to different colors and intensities is linear, but with varying sensitivity, as shown in FIG. 11B. The effect due to the bending of multiple CPRs in the array was measured and FIG. 11C shows that there is no significant variation in the response because of the bending. It is believed that a slight decrease in the array's response due to bending is due to the slight variation in the angle of the incident light, which might cause a slight decrease in the received incident light intensity. In this respect, note that the substrate 216 is selected to be a bendable polymer and thus, the entire first electrode 210 is bendable. Because the composite 220 is also bendable, and because the second electrode 212 is formed from plural second top electrodes 212*k*, the entire array 200 is bendable. In this application, the term "bendable" is understood to mean that a 5 by 5 cm array 200 can be bent to have a curvature radius of about 1 cm or less. The term "about" is understood in this application to mean between 5 and 10% of the reference value that is characterized by the term "about."

Figure 11D:
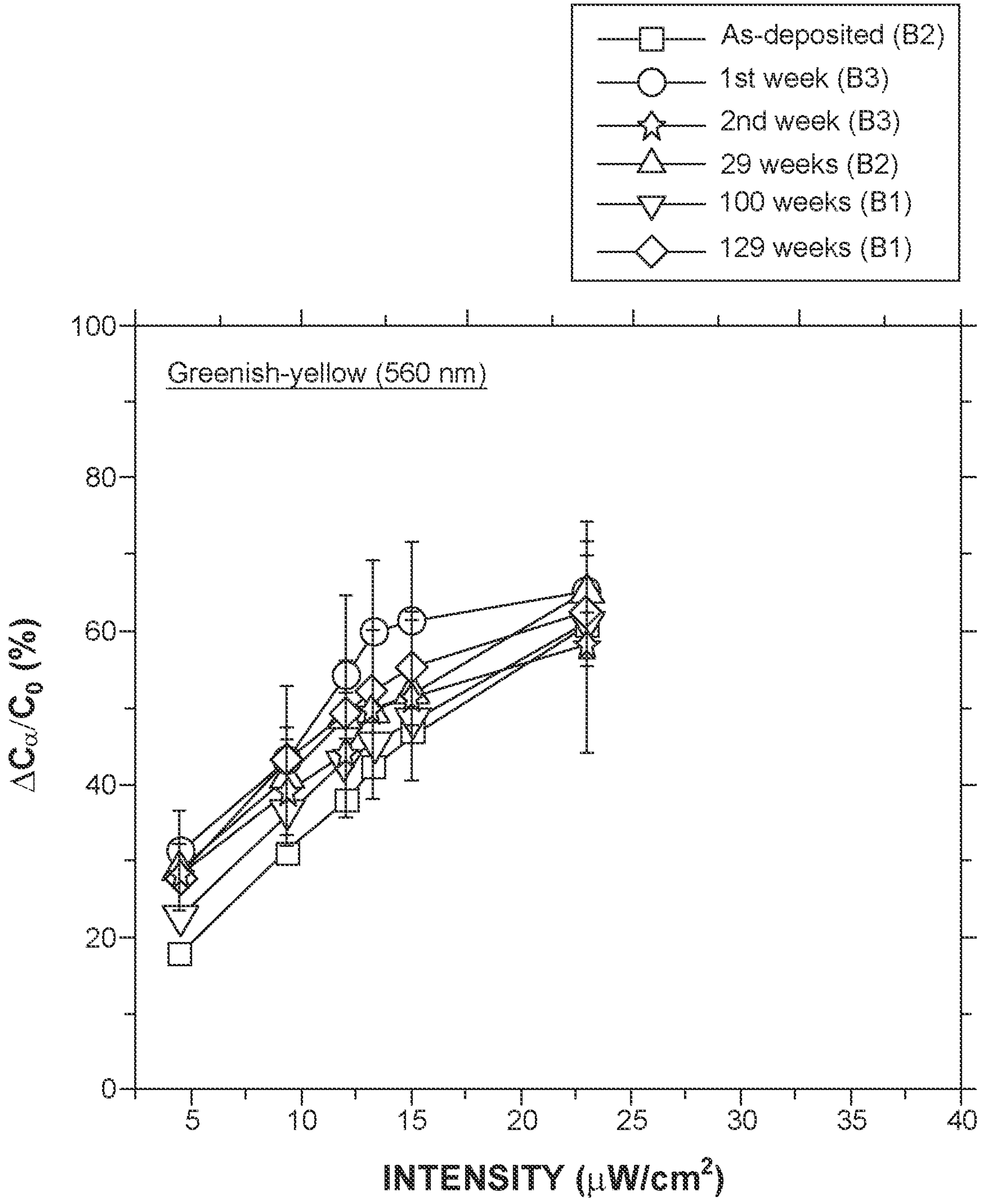
FIG. 11D shows the response of fabricated CPRs measured at various intervals after the vision sensor' fabrication, and the response shows the vision sensors being stable in air at least for 129 weeks after fabrication.

For testing the air stability of the CPR arrays 200, they were fabricated at various intervals in different batches (B1, B2, B3), B1 being the earliest batch, and B3 being the latest batch. These batches' response was tested under homogenized conditions at various time intervals to understand the arrays' air stability after storage. It was found that the arrays (batch-B1) are stable even after 129 weeks of storage in robust ambient conditions (placed in a petri dish, ~22-23° C. and 40% RH), and the response of all the arrays that were tested after several weeks is comparable to the recently made arrays, as illustrated in FIG. 11D. This shows the remarkable ambient stability of the arrays 200. Moreover, the tested arrays 200 also exhibited an excellent endurance of about 10,000 cycles under the illumination of modulating light pulses measured in ambient air. It was found that the endurance of the 129-week-old array is the same as of an as-deposited array, which further demonstrate the stability of the novel arrays 200.

It was found that the novel CPR 200*k* responds within 20 milliseconds, but the response saturates in 0.8 s after turning ON the LED, which is also similar to the adaptation mechanism of the human eye. The arrays 200 reach the baseline in about 0.92 s after they are turned OFF. Hence, to test the endurance of the arrays with a longer time exposure, the LED was programmed to turn on for about 10 s and then off for about 5 s, and the capacitance was measured for every 5 s. These tests also show that the arrays have a good stability under operation for at least 41 hours.

Figure 12A:
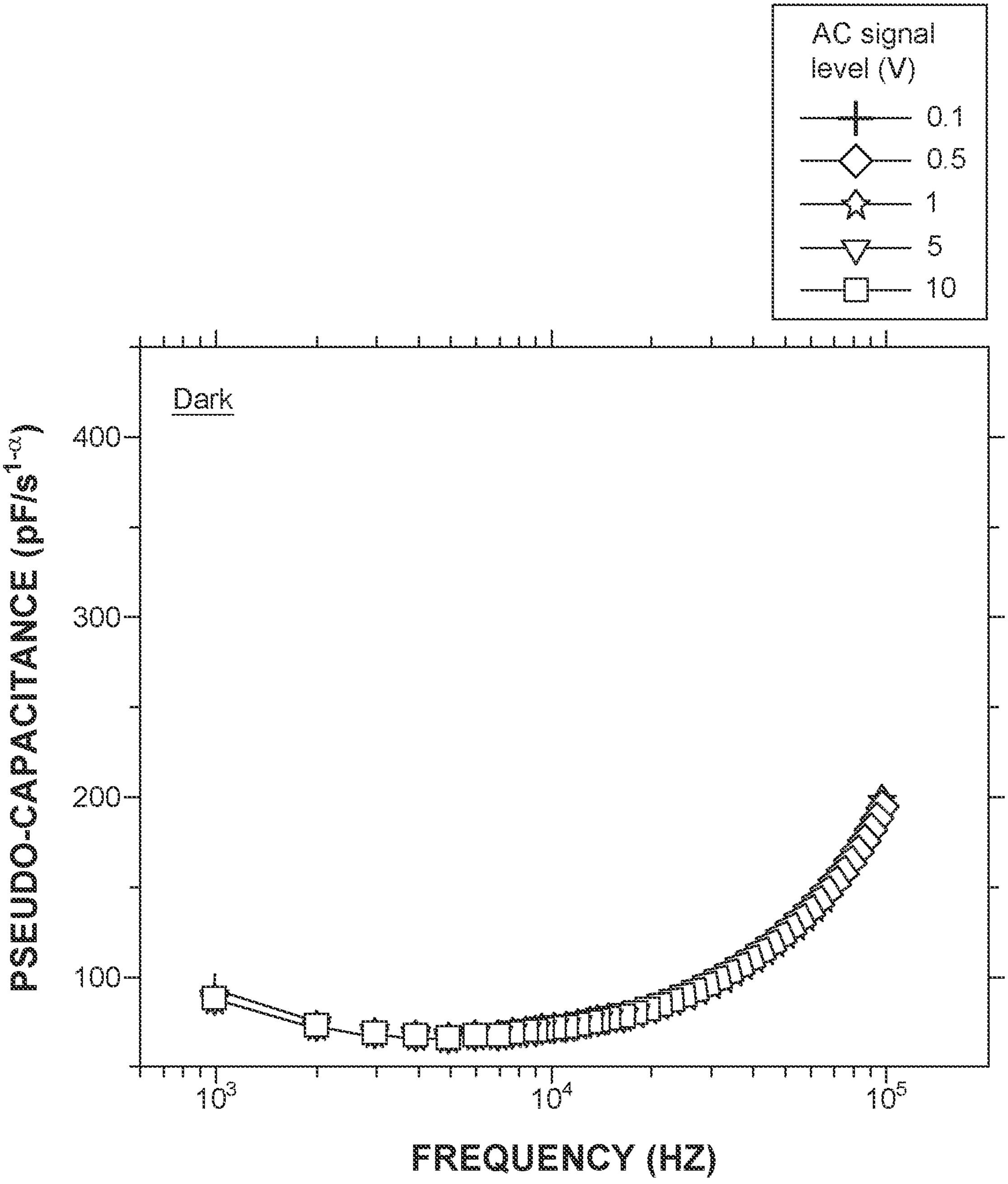
FIG. 12A shows the variation in the capacitance due to the AC signal level perturbations to study the effect of the photo-generated carriers in the conductivity modulation of the dielectric under dark.
Figure 12B:
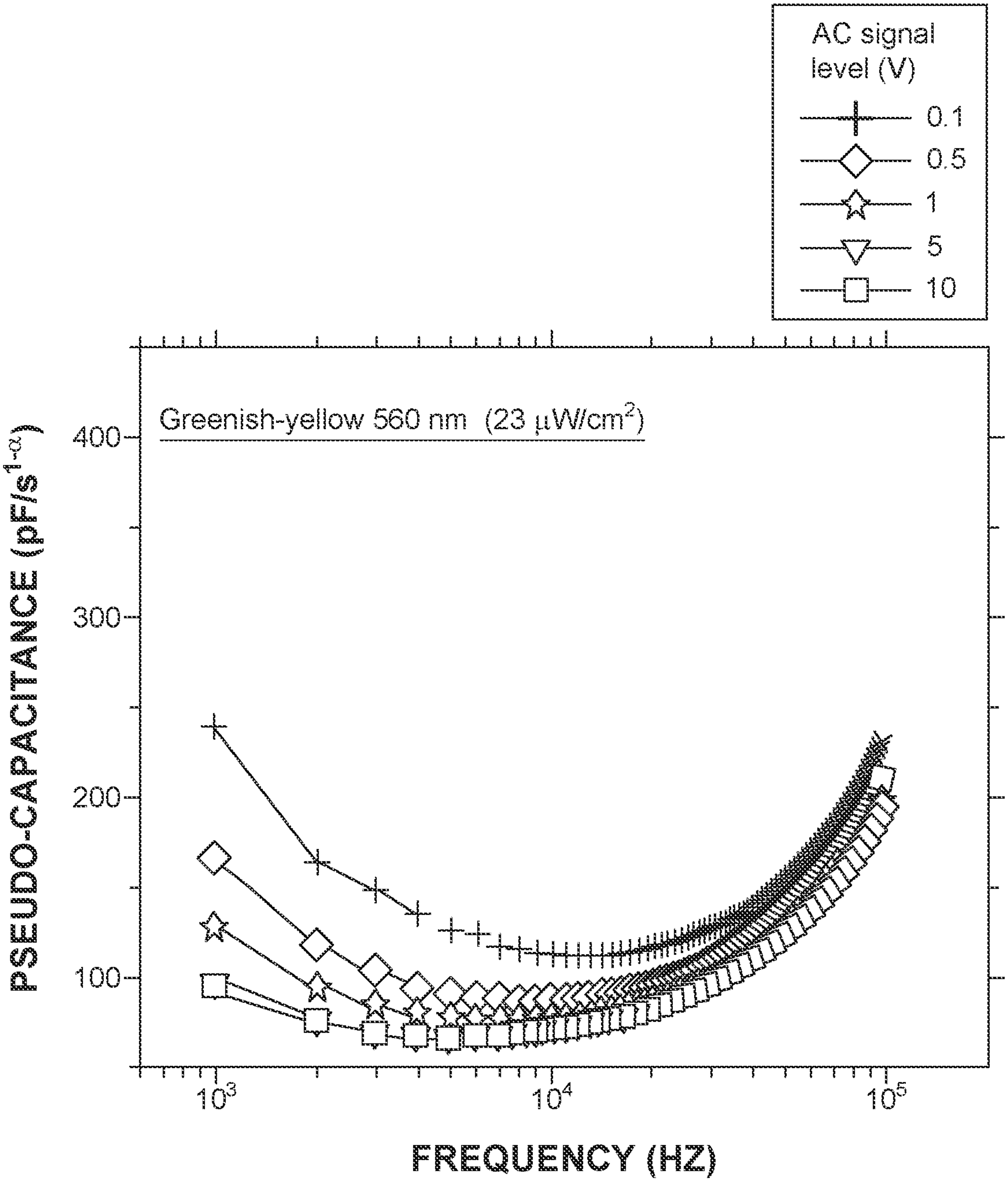
FIG. 12B shows the same under greenish-yellow light.

Next, the operation mechanism of the CPR array 200 is discussed. The metal halide perovskites are well known for their mixed electronic and ionic conduction mechanisms. The generation of non-equilibrium charge carriers upon light illumination is affecting their dielectric properties. To further understand the effect of photo-generated charge carriers, the CPR was characterized by varying the applied AC voltage magnitude ($V_{ac}$) under the dark and the greenish-yellow light conditions. As shown in the $C_a$ response plot of FIG. 12A under dark, there is no change in the pseudo-capacitance $C_a$ irrespective of the applied $V_{ac}$. In the presence of the greenish-yellow light, with the increase in the applied $V_{ac}$, there is a significant increase in the capacitance as illustrated in FIG. 12B. This means that for this frequency regime, and at higher $V_{ac}$, the charge carriers are getting modulated by the amplitude of the applied ac voltage and getting drifted towards the surface of the electrodes, thus making the dielectric/nanocomposite 220 less lossy. However, for smaller $V_{ac}$ magnitudes, the applied magnitude does not impact the charge carriers, and they are within the bulk of the dielectric, making the dielectric medium lossy. Moreover, under dark conditions, the nanocomposite's conductivity modulation is absent with varying $V_{ac}$, as shown in FIG. 12A, owing to the absence of photo-generated carriers. The charge distribution of non-equilibrium photo-generated carriers under various bias conditions confirms the CPR mechanism.

Figure 13A:
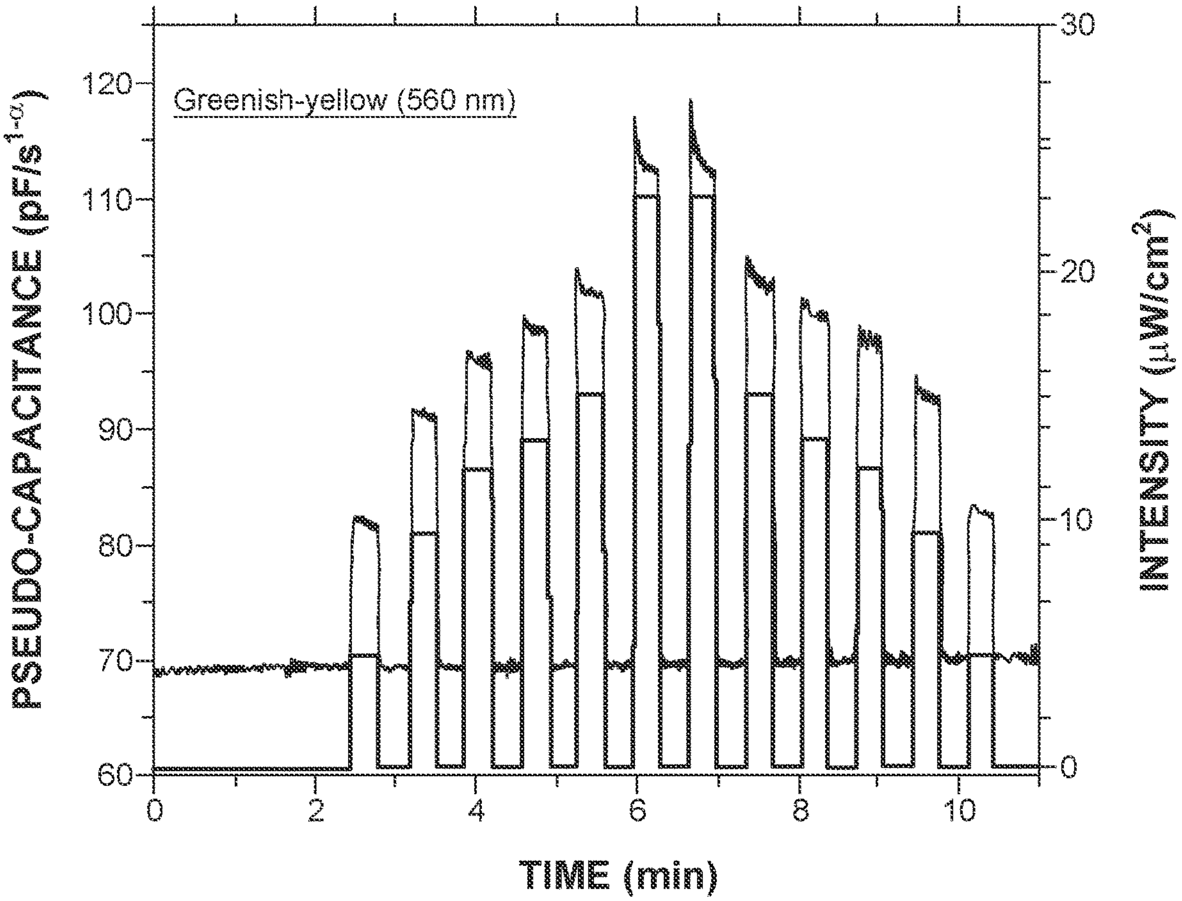
FIG. 13A shows the transient response of the CPRs (at 10 kHz) with increasing and the subsequent decreasing greenish-yellow light intensities.
Figure 13B:
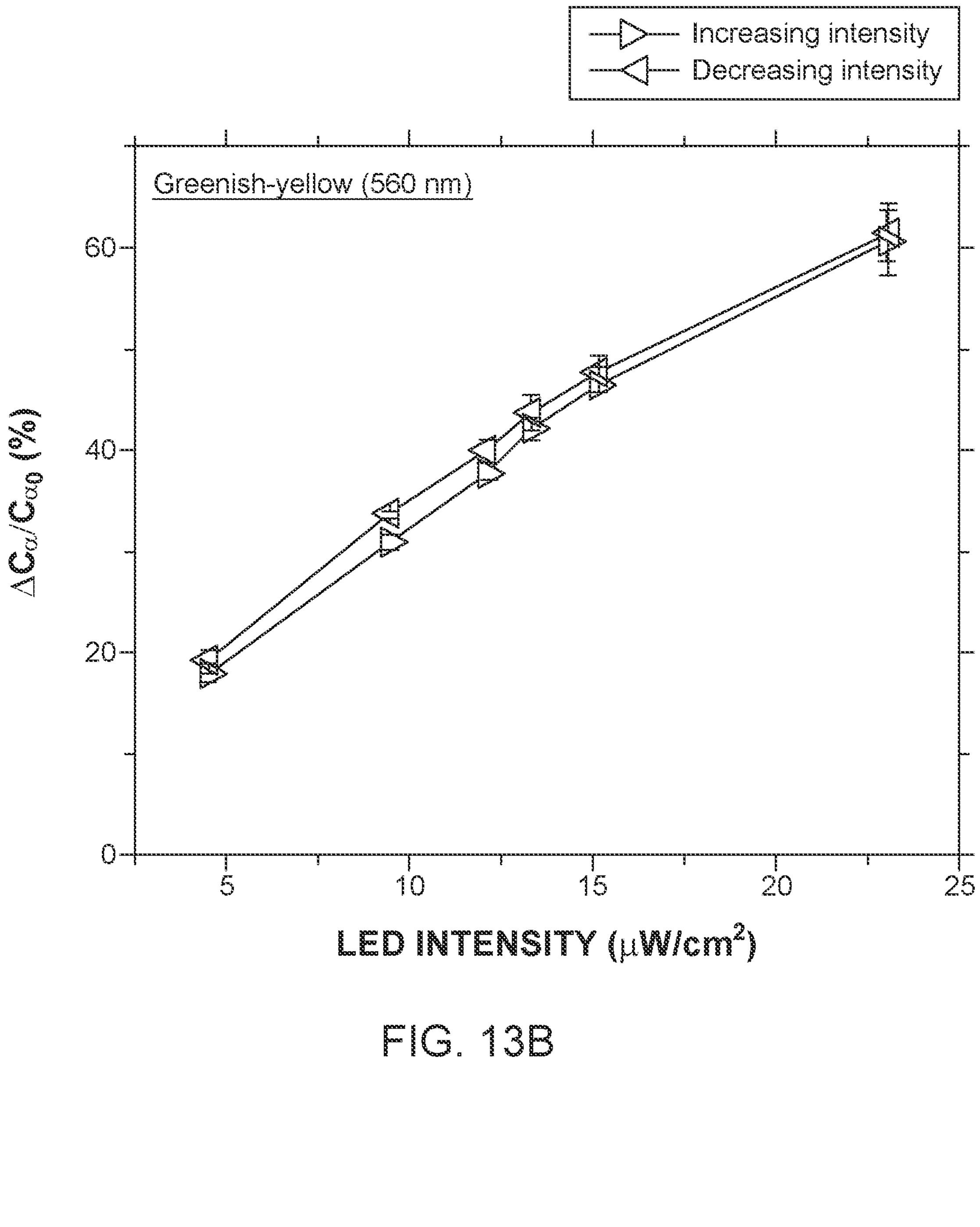
FIG. 13B shows the corresponding response of CPRs with the negligible charge accumulation and hysteresis.

In addition to this investigation, the inventors have investigated the CPRs to observe any charge accumulation within arrays after switching the light as well as changing the $V_{ac}$ signal levels. The transient response of the arrays was monitored by illuminating them with the increasing greenish-yellow light intensity and subsequently with the decreasing intensity of the same magnitude. It can be observed from FIGS. 13A and 13B that there is no significant effect of charge accumulation after switching, and the hysteresis is negligible. Thus, there is no memory effect in the CPRs 200*k*, which is desirable for any tunable device.

Figure 1B:
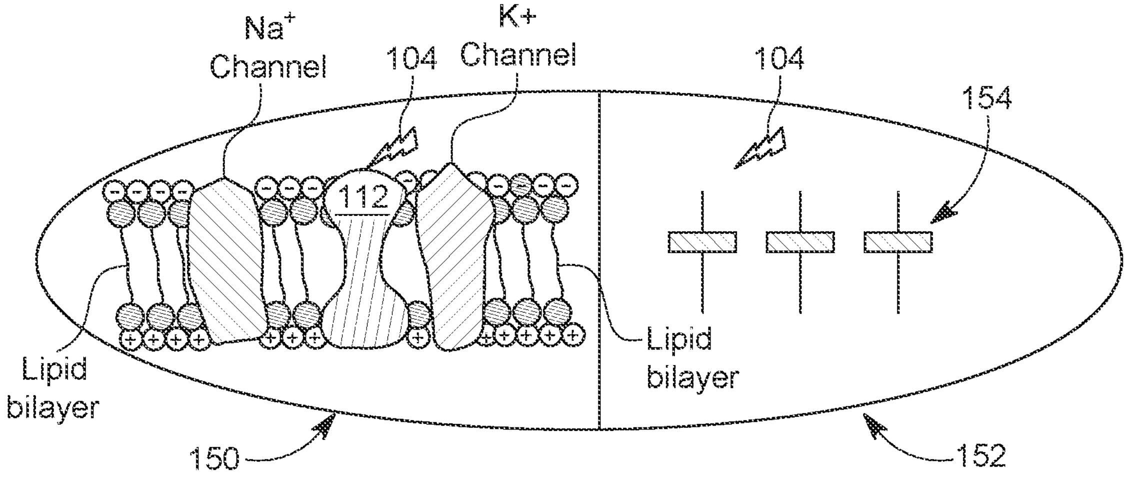

The CRP array 200 may be integrated within a system that also includes neuronal interface circuitry for processing the recorded light. The proposed CPR array 200 is intended to mimic the rod cells of the retina, and the system is intended to mimic the eye when implemented into a camera. Light-sensitive devices can be used to build electronics that generate the change in the spiking frequency, which is the functionality of the retina's ganglion cells discussed above with regard to FIGS. 1A and 1B. The CPRs array thus needs to be paired with a neural network for shape perception. Therefore, an interface circuit is needed to generate the spike train proportional to the light intensity and color. If the interface circuit generates a spike train proportional with the light intensity and the color, it means that the neuron of the neural network used with the interface circuit fires only when a threshold associated with a certain light intensity and a certain color is reached. For example, it is possible that the threshold has a first light intensity for green, a second light intensity for red, and so on for some or all the wavelengths in the visible spectrum. The neuron for a certain color will fire only when the light intensity for that color has been reached and thus generate a modified spike train. To achieve this goal, the CPR array is first characterized with the RC model illustrated in FIG. 8B, using nonlinear least squares under illumination scenarios. A curve fitted model is found that accurately describes the frequency behavior of the CPR array with a normalized root mean square error less than 3.3%.

Figure 14:
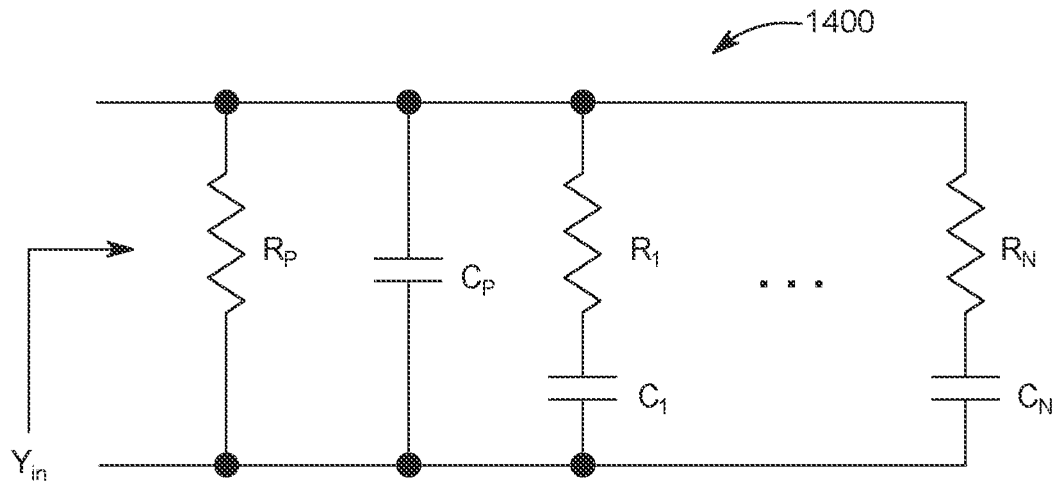
FIG. 14 shows the RC circuit model of the vision sensor of FIG. 3A.

The circuit model for the CPR array then needs to be incorporated into the retina simulators to design suitable interface circuits. To characterize the CPR array 200, an RC network 1400 model was used, as schematically shown in FIG. 14. This network is used to realize fractional-order capacitors. The input admittance of the network 1400 is defined as follows:

$$Y_{in} = \frac{1}{G_p} + sC_p + \sum_{k=1}^{N} \frac{sC_k}{sC_kR_k + 1}, \tag{2}$$

where $G_p$ and $C_p$ are the shunt conductance and capacitance, respectively, $R_k$ and $C_k$ are the resistance and capacitance, respectively, of the $k^{th}$ branch, N is the number of parallel branches, and k can take any value between 2 and N.

In order to extract values for the model parameters, the least-squares fitting function was used (for example, in MATLAB, Isqcurvefit), where a loss function is defined to minimize the $L^2$ norm of the relative error of the real and the imaginary parts of the admittance over the frequency range. The relative error was used to avoid the biased solution, which might result from unequal ranges of the real and imaginary parts like in the array 200, where the imaginary part is 30× higher than the real part of the impedance. The loss function used in this embodiment is defined as follows:

$$\min_x \sum_i^M \left(\frac{Y'_{in}(x, f_i) - Y'_{meas}(f_i)}{Y'_{meas}(f_i)}\right)^2 + \left(\frac{Y''_{in}(x, f_i) - Y''_{meas}(f_i)}{Y''_{meas}(f_i)}\right)^2, \tag{3}$$

where x is the search vector and is defined as $[R_p, C_p, R_1, C_1, \ldots, R_N, C_N]$, M is the number of the frequency points, $$Y'_{in} \text{ and } Y''_{in}$$

are the real and imaginary parts of the admittance model, and $$Y'_{in} \text{ and } Y''_{in}$$

are the real and imaginary parts of the measured admittance.

Figure 15A:
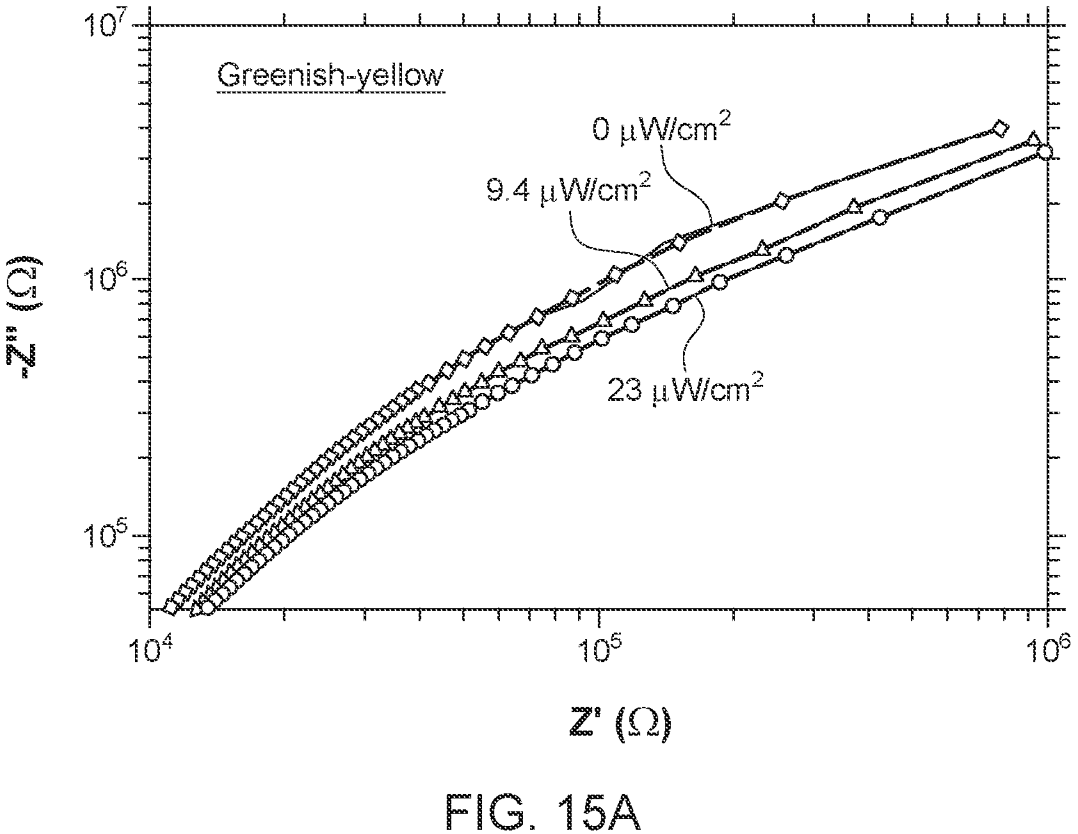
FIGS. 15A and 15B show the Nyquist impedance plots of the device model (dashed-squares lines) on top of the measured results (solid lines) for different colors and illumination intensities.
Figure 15B:
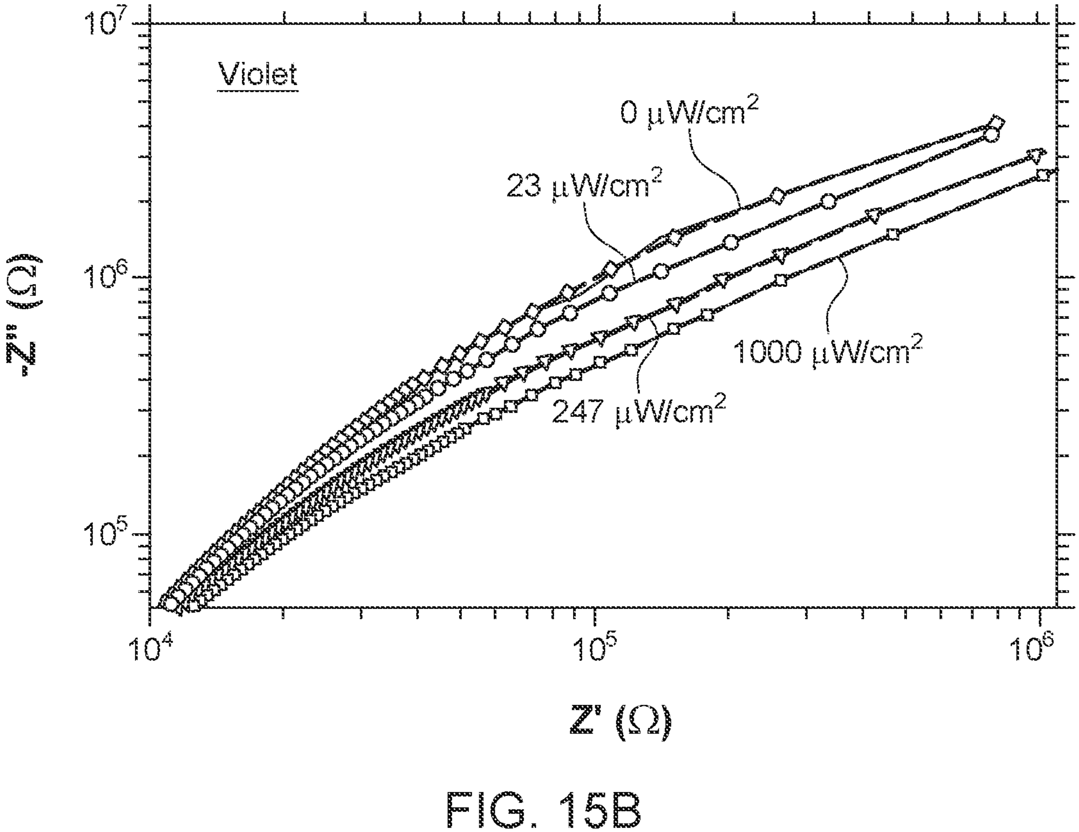

The proposed parameter identification algorithm was used to extract the device parameters with N=9. FIGS. 15A to 15B show the curved model results on top of the measured data showing a good matching. For better visibility of the results, only some selected cases are presented. Table 1 in FIG. 16 shows the normalized root mean square error results of the curve fitted model with at most 3.37% error.

Figure 17A:
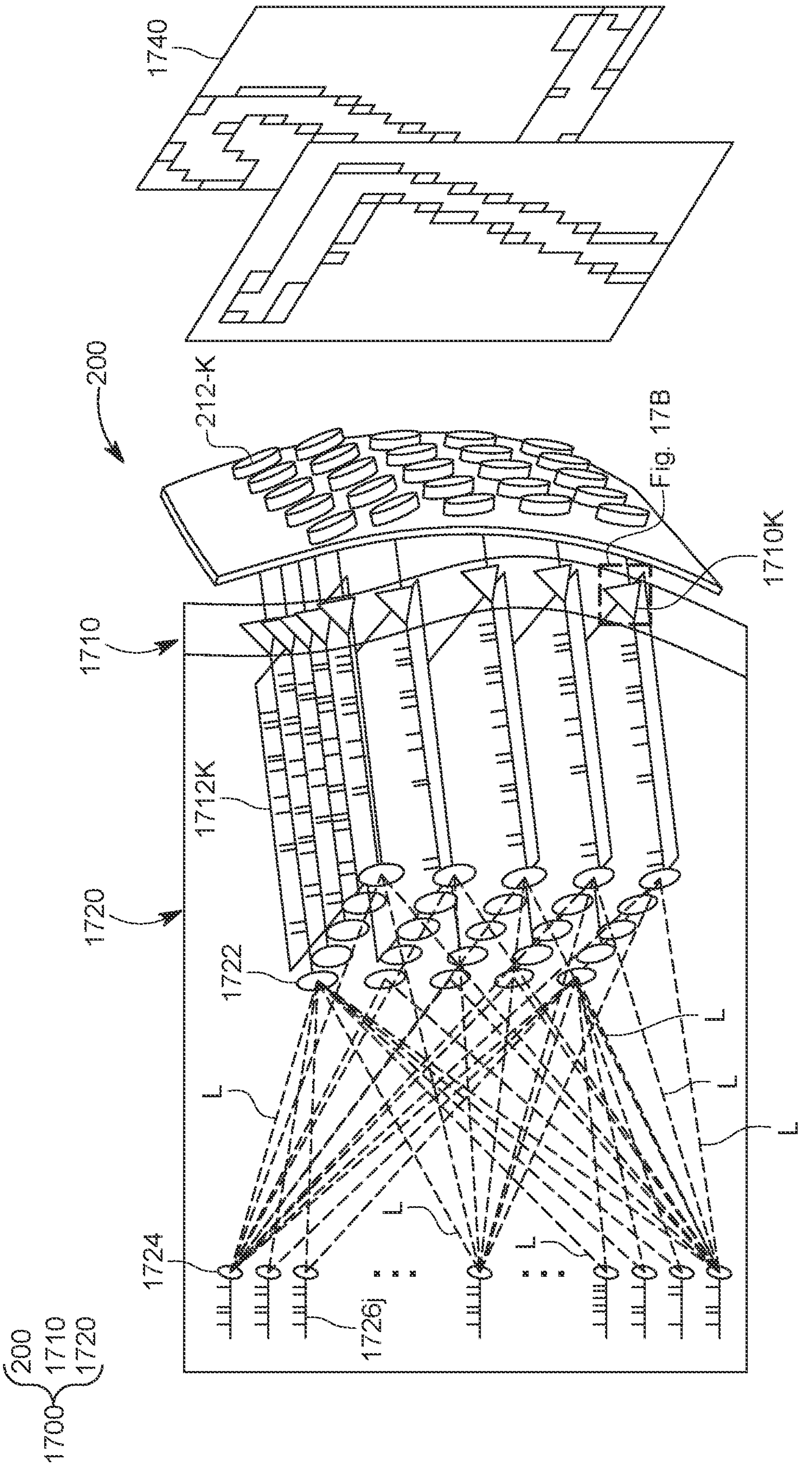
FIG. 17A illustrates a system based on the vision sensor and having a spiking neural network processing a spike train, generated after seeing handwritten digits.

An illustrative diagram showing the CPR array 200 connected to a sensing circuit system 1710 followed by a spiking neural network 1720 for processing the received information is depicted in FIG. 17A. These components form the vision sensor 1700. Note that a spiking neural network (SNN) is an artificial neural network that more closely mimic natural neural networks. In addition to neuronal and synaptic state, the SNN incorporate the concept of time into its operating model. In other words, neurons in the SNN do not transmit information at each propagation cycle (as it happens with typical multi-layer perceptron networks), but rather transmit information only when a membrane potential—an intrinsic quality of the neuron related to its membrane electrical charge—reaches a specific value, called the threshold. When the membrane potential reaches the threshold, the neuron fires, and generates a signal that travels to other neurons which, in turn, increase or decrease their potentials in response to this signal. A neuron model that fires at the moment of threshold crossing is also called a spiking neuron model.

Figure 17B:
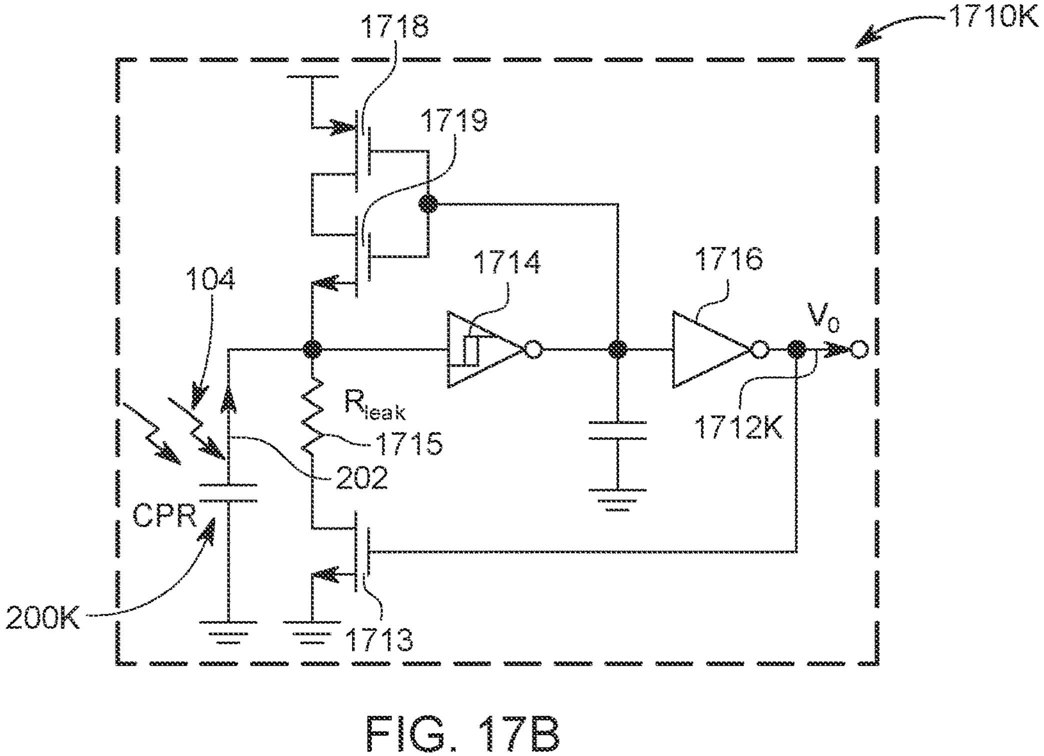
FIG. 17B shows a low power CMOS circuit designed to interface with the CPR to generate the spike train.

The sensing circuit system 1710 may be implemented, in this embodiment, as plural CMOS sensing circuits 1710*k*, the structure of one of which being shown in FIG. 17B. Each sensing circuit 1710*k* is designed for interfacing with a single CPR 200*k* of the CPR array 200 for generating a corresponding spike train signal 1712*k* with a frequency that is proportional to incident light 104's intensity. This signal is the received by the spiking neuron previously discussed to incorporate the time into the network 1720. Note that the array 200 changes the light 104 into electrical signals 202 and these electrical signals 202 are transformed by the sensing circuit system 1710 into the spike train signals 1712*k*. For this reason, the sensing circuit 1710*k* includes first and second amplifiers 1714 and 1716 that are connected in series. Two transistors 1718 and 1719 have their gates commonly connected to an output of the first amplifier 1714. The drain and base of the two transistors are connected to each other. A third transistor 1713 is connected to ground, an output of the second amplifier 1716, and to a common point. The common point is also connected to the input of the first amplifier 1714, the drain of the second transistor 1719, and to the corresponding CPR 200*k*. In one application, each second electrode 212*k* of the array 200 is connected to a corresponding sensing circuit 1710*k*.

Figure 17C:
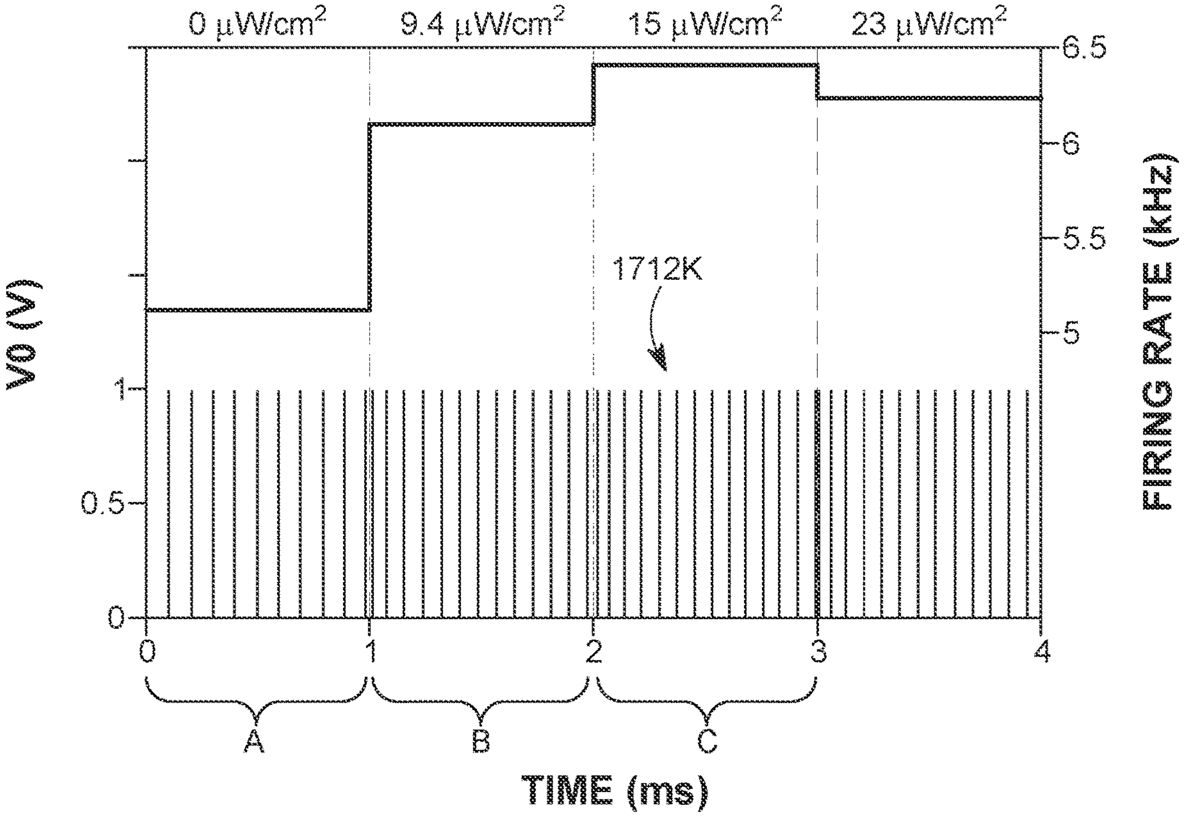
FIG. 17C illustrates the output spike train under greenish-yellow light and different illumination intensities.

By varying the incident light 104's intensity for different colors, different spike frequencies are recorded because each light and intensity has a different impact on the array 200, as already discussed. A sample of the spike train signal 1712*k* is shown in FIG. 17C and this spike train was generated under the illumination of greenish-yellow light. A leakage resistor $R_{leak}$ 1715 in the sensing circuit 1710*k* may be connected, as shown in FIG. 17B, between the common point and the source of the third transistor 1713, and this transistor can be used to tune the spike rate of the spike train signal 1712*k*. The higher the leakage resistor $R_{leak}$, the lower the firing rate. Note that the spike train signal 1712*k* shown in FIG. 17C indicates that for no incoming light (i.e., zero energy region A), the spike frequencies have a certain spacing in time. However, as the energy increases for region B, more spiking frequencies are present, with the region C, which receives the most amount of energy, having the highest number of spiking frequencies for the given amount of time. The graph indicates that the more energy is received by a given CPR 200*k*, the more spiking frequencies per unit of time are generated, which in essence encodes the light intensity into the spike train signal 1712*k*. These spike train signals 1712*k* are then processed by the neural network 1720, which generates corresponding modified spike train signals 1726*j*, which are then fed to the controller of a camera if the vision sensor 1700 is implemented as the vision sensor for that camera. If the vision sensor 1700 is implemented as an artificial retina, then the sensing system 1710 and the neural network 1720 can be omitted as the outputs from the array 200 need to be directly connected to the optical nerve of the eye. If the vision sensor 1700 is implemented within a robot (e.g., a drone or autonomous vehicle), then these modified spike train signals 1712*j* may be fed to the controller of that robot. The index j stands for the number of output neurons of the neural network 1720 and can have any desired value. For the robot implementation, the index j may be selected to be equal to the number of desired characters to be recognized. Also note that FIG. 17C shows the spike train signal 1712*k* in response to a given color. For different colors, different spike train signals will be generated with different regions A-C and different corresponding energy thresholds.

Figure 17D:
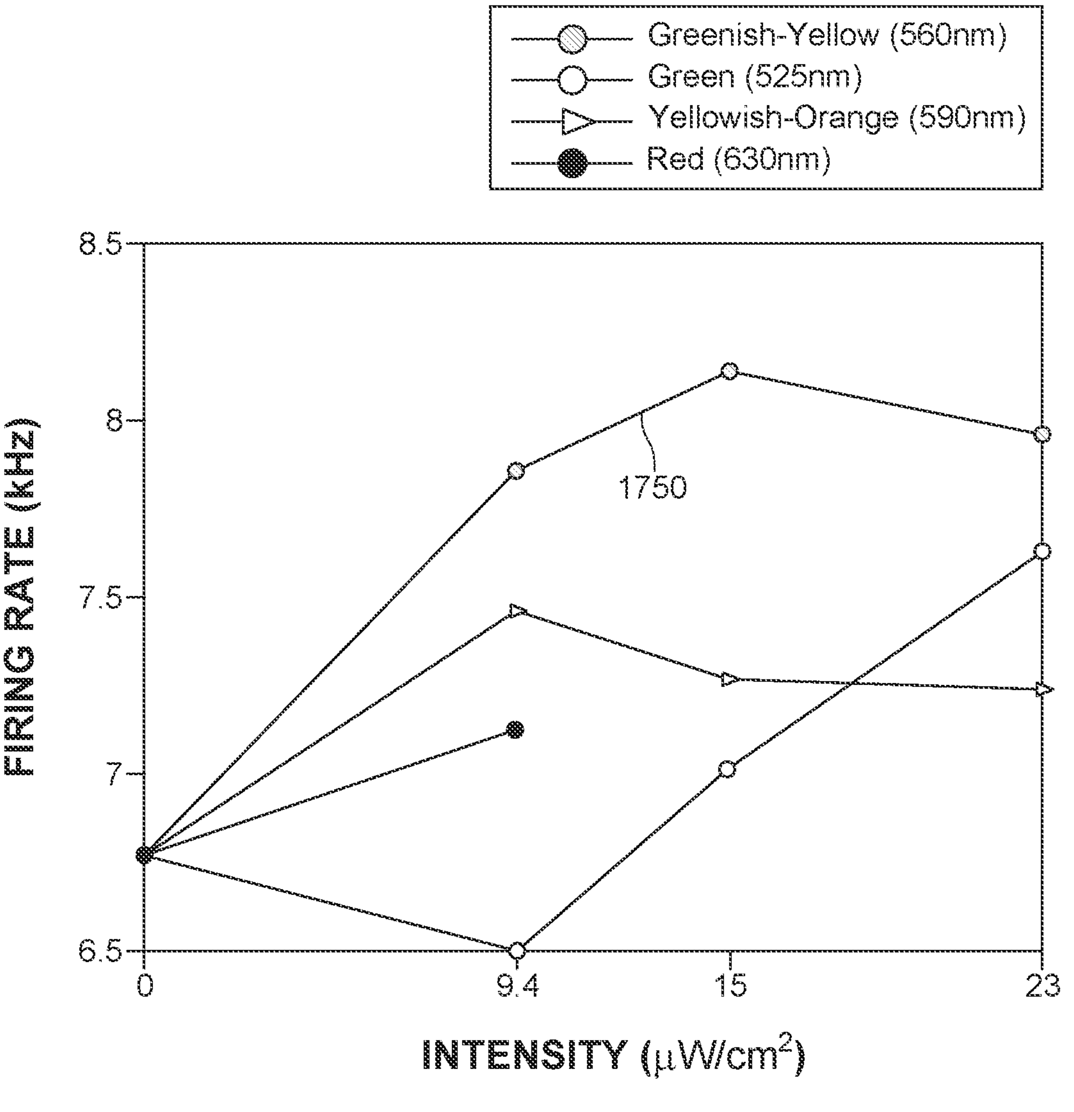
FIG. 17D illustrates the firing rate under different light intensities and colors.

In order to evaluate the CPR array 200, different scenarios were tested, where the incident light's intensity was varied for different colors, as depicted in FIG. 17D. It was observed that the firing rate (i.e., spike frequency) increases with the increase in light intensity, which is also observed for different colors, as shown in FIG. 17D. The greenish-yellow curve 1750 shows a better dynamic range (spanning from 6.7 kHz to 8.2 kHz) compared to the other colors, which means better representation/encoding of the incident light intensity. The generated spike train signals 1712*k* can then be interfaced with any neuromorphic hardware such as Truenorth or Loihi to mimic the full functionality of the retina networks.

The CPR array 200 with the interface circuit system 1710 of the vision sensor 1700 was simulated to interface with a spiking neural network (SNN) 1720 to recognize handwritten digits 1740, as shown in FIG. 17A. The pixels of the handwritten digits were encoded proportional to the light intensity, then converted to spike train signals 1712*k*, as discussed above. The SNN 1720 in this embodiment is a single-layer network with k input neurons 1722 (where k is the number of CPRs 200*k* that form the array 200) and 100 output neurons 1724 (in this case, j=100) that generate the modified spike train signals 1726*j* discussed above, and the SNN employs a winner-take-all (WTA) mechanism followed by a statistical output classifier. The network was trained with simplified spike-timing-dependent plasticity, STDP, with a leaky integrate-and-fire neuron model. In this embodiment, STDP training was used, which is more brain-plausible. The trained model was used, without retraining, to evaluate the performance of CPRs array 200 and the interface circuit 1710, where the feature maps have already been learned in the initial training, and there is no need to retrain the network. The network 1720 shows 70.98% and 72.05% recognition accuracy for greenish-yellow and violet lights, respectively. The accuracy loss is due to the nonlinearity of the simple interface circuit 1710. Further optimized circuits can be used to enhance the overall linearity and sensitivity, which would be reflected in the SNN accuracy to bridge the 15% drop. The state-of-the-art training models have shown 87.25% accuracy in recognizing the MNIST dataset. The low recognition accuracy is due to the shallowness of the used network and that unsupervised training is used. The accuracy can reach 95% by increasing the number of output neurons 1724 to 1500, or by applying state-of-art supervised learning methods such as SuperSpike or DECOLLE.

Figure 18:
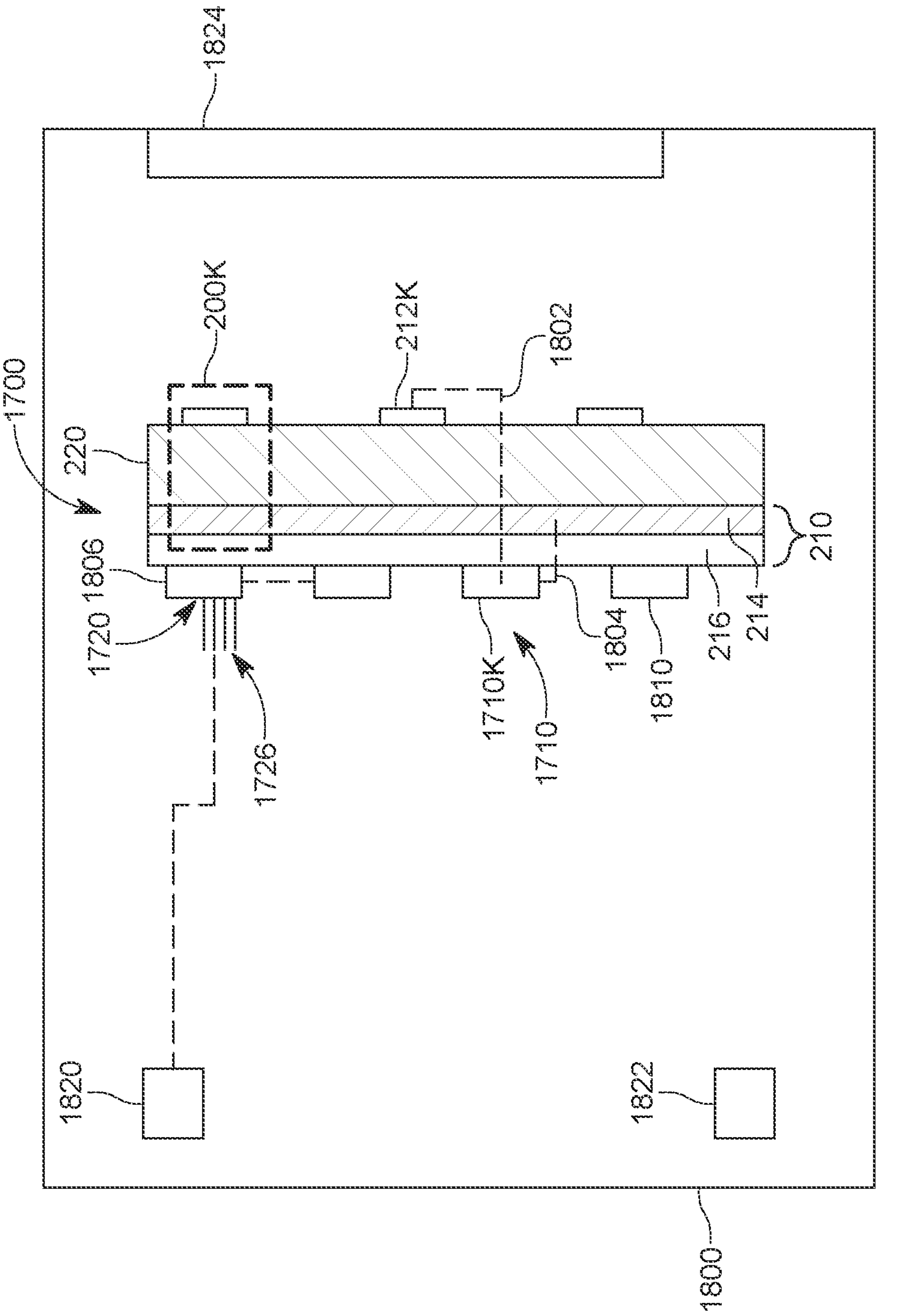
FIG. 18 illustrates a vision system based on the vision sensor shown in FIG. 3A.

The vision sensor 1700 illustrated in FIG. 17A may be implemented as the vision sensor for a camera 1800, or as an artificial retina in the eye of a person. A side view of the vision sensor 1700 is shown in FIG. 18 as being part of the camera 1800. It is noted that each of the second electrode 212*k* is electrically connected with a first corresponding wire 1802 to a corresponding sensing circuit 1710*k* (only one such connection is shown in the figure for simplicity). Further, each of the sensing circuit 1710*k* is connected to the first electrode 214 with a second corresponding wire 1804 (again only one connection is shown in the figure for simplicity). Further, each sensing circuit 1710*k* is electrically connected to a processor 1806, in which the SNN network 1720 is implemented. The entire device may be encapsulated into a transparent material (not shown). The SNN network 1720 has plural outputs 1726 that need to be connected to a general processor 1820 of the camera 1800. The vision sensor 1700 may also include a power source 1810 (e.g., a battery) for supplying power to the processor 1806. In one application, energy from one or more CPRs 200*k* may be used to power the processor 1806. In another embodiment, the energy may be supplied from a power source 1822 of the camera 1800. The camera may also include optics 1824 for controlling the amount of light that is applied to the CPRs 200*k*.

The embodiments discussed above have disclosed the fabrication of tunable and flexible capacitive photoreceptors using a hybrid nanocomposite of metal halide perovskite ($CH_3NH_3PbBr_3$) and ferroelectric polymer (PVDF-TrFE-CFE). A ferroelectric material is a material that has a spontaneous electric polarization that can be reversed by the application of an external electric field. Most of the known materials do not have this property. The purity and morphology of the perovskite nanocrystals are undisturbed in the nanocomposite and exhibited excellent light absorption properties. The CPR's capacitance is tunable and reproducible with the light intensity and frequency independent in the 1 kHz to 100 kHz regime at each applied light intensity. The stable and non-degradable performance of metal halide perovskite nanocrystals-based devices was observed for 129-weeks. The highly sensitive CPR 200*k* mimics the rod cells of the retina. The developed CPR array 200 was interfaced with sensing circuitry and a neural network to demonstrate its functionality as a biomimetic retina. Such CPRs may also be used in developing photosensitive actuators for robotic applications, and these can also be explored as optoelectronic devices for optical communications.

It should be understood that the above description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

The entire content of all the publications listed herein is incorporated by reference in this patent application.

[1] A. Zaher, S. Li, O. Yassine, N. Khashab, N. Pirmoradi, L. Lin, J. Kosel: "Osmotically driven drug delivery through remote-controlled magnetic nanocomposite membranes". Biomicrofluidics, vol. 9, no. 5, p. 054113, 2015. [1] Y. Chai, *Nature* 2020, 579, 32.

[2] L. Bao, J. Kang, Y. Fang, Z. Yu, Z. Wang, Y. Yang, Y. Cai, R. Huang, *Scientific Reports* 2018, 8, 13727.

[3] L. Mennel, J. Symonowicz, S. Wachter, D. K. Polyushkin, A. J. Molina-Mendoza, T. Mueller, *Nature* 2020, 579, 62.

[4] Z. Wang, M. Rao, J.-W. Han, J. Zhang, P. Lin, Y. Li, C. Li, W. Song, S. Asapu, R. Midya, Y. Zhuo, H. Jiang, J. H. Yoon, N. K. Upadhyay, S. Joshi, M. Hu, J. P. Strachan, M. Barnell, Q. Wu, H. Wu, Q. Qiu, R. S. Williams, Q. Xia, J. J. Yang, *Nature Communications* 2018, 9, 3208.

[5] L. Gu, S. Poddar, Y. Lin, Z. Long, D. Zhang, Z. Qianpeng, L. Shu, X. Qiu, M. Kam, A. Javey, and Z. Fan, (2020). A biomimetic eye with a hemispherical perovskite nanowire array retina. *Nature*. 581. 278-282. 10.1038/s41586-020-2285-x.

[6] P. Lichtsteiner, C. Posch, T. Delbruck, *IEEE Journal of Solid-State Circuits* 2008, 43, 566.

[7] A. L. Kholkin, S. O. lakovlev, J. L. Baptista, *Applied Physics Letters* 2001, 79, 2055.

[8] J. Lee, S. Esayan, A. Safari, R. Ramesh, *Applied Physics Letters* 1994, 65, 254.

[9] T. Miyasaka, T. N. Murakami, *Applied Physics Letters* 2004, 85, 3932. M. Mokni, F. Pedroli, G. D'Ambrogio, M.-Q. Le, P.-J. Cottinet, J.-F. Capsal, Polymers 2020, 12.

[11] H. Lee, J. Kim, H. Kim, Y. Kim, *Scientific Reports* 2016, 6, 19527.

[12] L. Zhang, D. Shi, T. J. Huang, R. Huang, H. Gong, *Nanoscale* 2017, 9, 18430.

[13] A. M. Al-Amri, B. Cheng, J. He, *IEEE Transactions on Nanotechnology* 2019, 18, 1.

[14] J. Zhou, Y. Chu, J. Huang, *Acs Applied Materials & Interfaces* 2016, 8, 25660.

[15] A. Agambayev, M. Farhat, S. P. Patole, A. H. Hassan, H. Bagci, K. N. Salama, *Applied Physics Letters* 2018, 113, 093505.

What is claimed is:

1. A capacitive photoresistor array having frequency-independent capacitance, the array comprising:

first and second electrodes; and a composite material including a perovskite and a terpolymer, wherein the composite material is sandwiched between the first electrode and the second electrode, and wherein a capacitance of the array changes proportionally with a light intensity for visible light and is independent of light frequency due to a combination of the perovskite and the terpolymer.

2. The array of claim 1, wherein the perovskite includes methylammonium lead bromide and the terpolymer consists of (1) polyvinylidene fluoride, (2) trifluoroethylene, and (3) chlorofluoroethylene.

3. The array of claim 2, wherein the first electrode includes Al and the second electrode includes indium tin oxide.

4. The array of claim 1, wherein the second electrode is formed of plural, individual second electrodes, the first electrode is a single electrode, and the plural, individual second electrodes, the first electrode, and the composite material form plural, individual capacitors connected in parallel.

5. The array of claim 4, wherein the plural, individual second electrodes of the second electrode are uniformly distributed over the composite material.

6. The array of claim 4, wherein a portion of the composite material that extends among the plural, individual second electrodes, is directly exposed to an ambient.

7. The array of claim 1, wherein the perovskite is fully encapsulated by the terpolymer.

8. The array of claim 1, wherein the first electrode includes a metal coated substrate, and the substrate is bendable so that the entire array has a curvature radius of 1 cm or less for a size of the array of about 2 by 2 $cm^2$.

9. A vision sensor for generating spike train signals with a firing rate proportional to an incident light intensity and a corresponding color received from an object, the sensor comprising:

a capacitive photoresistor array having a frequency-independent capacitance, the array configured to transform the incident light into electrical signals;

a sensing circuit system connected to the array and configured to transform the electrical signals into the spike train signals; and a spiking neural network, SNN, connected to the sensing circuit and configured to identify the object based on the spike train signals received from the sensing circuit system.

10. The sensor of claim 9, wherein the array comprises: first and second electrodes; and a composite material including a perovskite and a terpolymer, wherein the composite material is sandwiched between the first electrode and the second electrode, and wherein the capacitance of the array changes proportionally with a light intensity for visible light.

11. The sensor of claim 10, wherein the perovskite includes methylammonium lead bromide and the terpolymer consists of (1) polyvinylidene fluoride, (2) trifluoroethylene, and (3) chlorofluoroethylene.

12. The sensor of claim 11, wherein the first electrode includes Al and the second electrode includes indium tin oxide.

13. The sensor of claim 10, wherein the second electrode is formed of plural, individual second electrodes, the first electrode is a single electrode, and the plural, individual second electrodes, the first electrode, and the composite material form plural, individual capacitors connected in parallel.

14. The sensor of claim 13, wherein the plural, individual second electrodes of the second electrode are uniformly distributed over the composite material.

15. The sensor of claim 13, wherein a portion of the composite material that extends between the plural, individual second electrodes, is directly exposed to an ambient.

16. The sensor of claim 10, wherein the perovskite is fully encapsulated by the terpolymer.

17. The sensor of claim 10, wherein the first electrode includes a metal coated substrate, and the substrate is bendable so that the entire array has a curvature radius of 1 cm or less for a size of the array of about 2 by 2 $cm^2$.

18. The sensor of claim 9, wherein the sensing circuit system comprises plural sensing circuits, each sensing circuit including plural transistors and plural amplifiers that receive an electrical signal from a single capacitor of the capacitive photoresistor array and generate a corresponding spike train signal.

19. The sensor of claim 9, wherein the spiking neural network comprises:

plural input neurons, each configured to receive a corresponding spike train signal from a corresponding sensing circuit of the sensing circuit system; and plural output neuros.

20. The sensor of claim 19, wherein a number of the plural input neurons is equal to a number of capacitors forming the capacitive photoresistor array.

* * * * *